United States Patent
Lin et al.

(10) Patent No.: US 12,267,006 B2
(45) Date of Patent: Apr. 1, 2025

(54) FORMING INTEGRATED ELECTRONIC DEVICES FOR CONVERTING AND DOWNSCALING ALTERNATING CURRENT

(71) Applicant: Taiwan Semiconductor Manufacturing Company, Ltd., Hsinchu (TW)

(72) Inventors: Yen-Ku Lin, Zhubei (TW); Ru-Yi Su, Kouhu Township (TW); Haw-Yun Wu, Zhubei (TW); Chun-Lin Tsai, Hsin-Chu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 395 days.

(21) Appl. No.: 17/806,670

(22) Filed: Jun. 13, 2022

(65) Prior Publication Data

US 2023/0402937 A1 Dec. 14, 2023

(51) Int. Cl.
| | |
|---|---|
| *H02M 3/00* | (2006.01) |
| *H01L 25/07* | (2006.01) |
| *H02M 1/00* | (2007.01) |
| *H02M 1/42* | (2007.01) |
| *H02M 3/335* | (2006.01) |
| *H02M 7/00* | (2006.01) |
| *H02M 7/219* | (2006.01) |

(52) U.S. Cl.
CPC .......... *H02M 3/003* (2021.05); *H01L 25/074* (2013.01); *H02M 1/007* (2021.05); *H02M 1/4233* (2013.01); *H02M 3/01* (2021.05); *H02M 3/33571* (2021.05); *H02M 7/003* (2013.01); *H02M 7/219* (2013.01)

(58) Field of Classification Search
CPC .... H02M 3/01; H02M 3/003; H02M 3/33571; H02M 3/33573; H02M 7/003
See application file for complete search history.

(56) References Cited

U.S. PATENT DOCUMENTS

| | | | |
|---|---|---|---|
| 10,879,341 B2 * | 12/2020 | Song | ................. H01L 23/49822 |
| 2005/0083714 A1 * | 4/2005 | Zhu | .................... H02M 3/33576 |
| | | | 363/17 |
| 2018/0374845 A1 * | 12/2018 | Colinge | .......... H01L 21/823437 |
| 2019/0273059 A1 * | 9/2019 | Chang | ................. H01L 23/5226 |
| 2020/0098828 A1 * | 3/2020 | Chen | .................... H10N 70/021 |
| 2021/0134964 A1 * | 5/2021 | Ho | ....................... H01L 23/5283 |

* cited by examiner

Primary Examiner — Jue Zhang
(74) Attorney, Agent, or Firm — Harrity & Harrity, LLP

(57) ABSTRACT

Bonding a full-bridge device and an LLC device in a stack, or forming the full-bridge device and the LLC device on a same substrate, rather than connecting the devices, reduces a chip area associated with a power converter including the full-bridge device and the LLC device. Additionally, the full-bridge device and the LLC device consume less power because parasitic inductance and capacitance are reduced. Additionally, raw materials and production time are conserved that would otherwise have been used to connect the full-bridge device and the LLC device (e.g., via wires).

20 Claims, 25 Drawing Sheets

FORMING INTEGRATED ELECTRONIC DEVICES FOR CONVERTING AND DOWNSCALING ALTERNATING CURRENT

BACKGROUND

In order to downconvert voltage at a power converter for many electronics, a full-bridge device that converts alternating current to direct current (DC) may be coupled with an inductor-inductor-capacitor (LLC) device that reduces a voltage of the DC. Both devices include circuits with transistors that are driven by particular gate voltages. Generally, the full-bridge gate is formed with a higher breakdown voltage (e.g., 650 Volts (V)) than the LLC device (e.g., 100 V).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
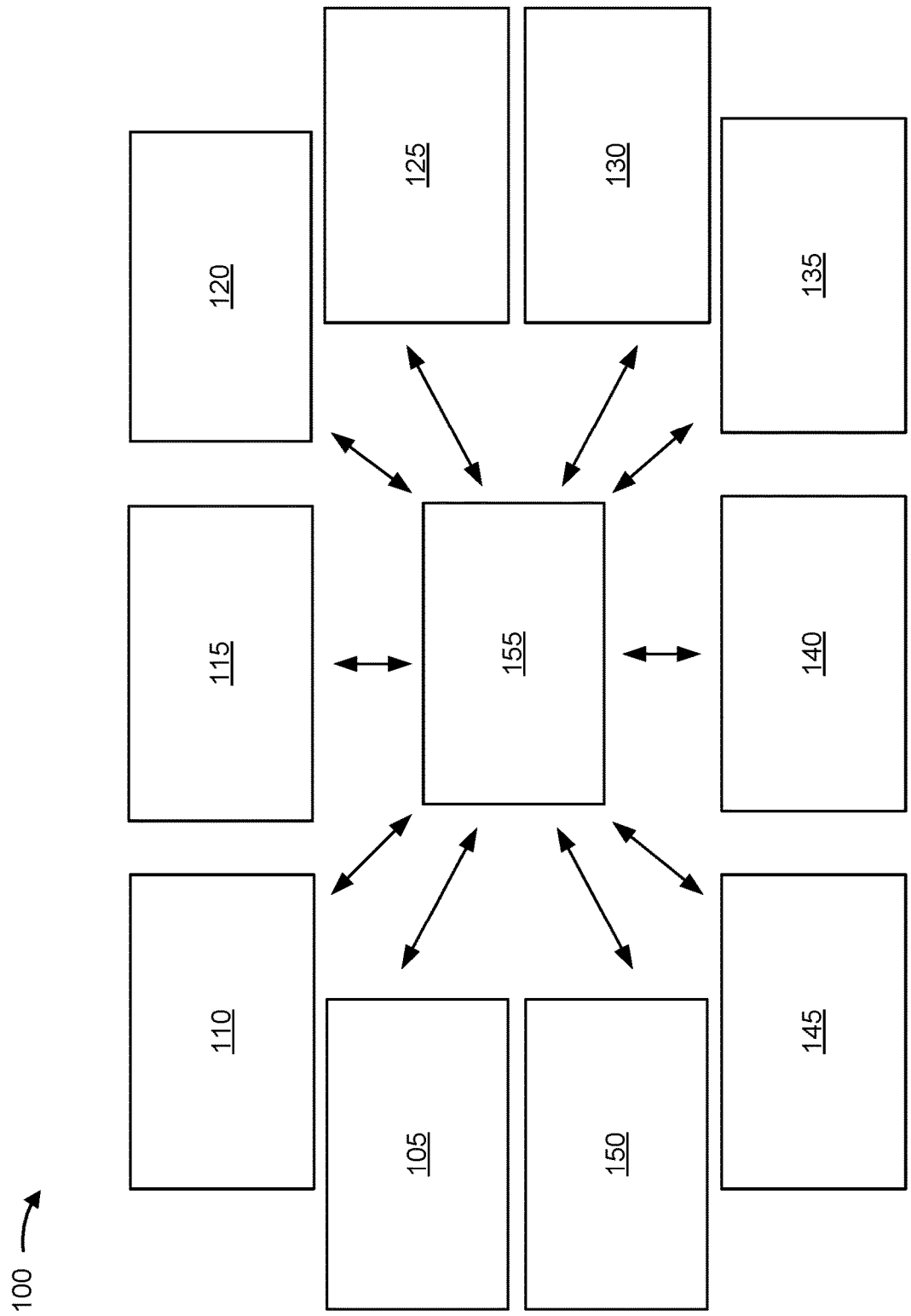
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In order to downconvert voltage at a power converter for many electronics, a full-bridge device that converts alternating current (AC) to direct current (DC) may be formed on a first substrate and connected to an inductor-inductor-capacitor (LLC) device that reduces a voltage of the DC and is formed on a second substrate. However, a chip area associated with the power converter is large. Additionally, the full-bridge device and the LLC device may consume additional power due to parasitic inductance and capacitance. Finally, connecting the full-bridge device and the LLC device consumes additional raw materials and production time.

In the packaging of integrated circuits, semiconductor dies may be stacked through bonding and may be bonded to other package components such as interposers and package substrates. The resulting packages are known as three-dimensional integrated circuits (3DICs). Accordingly, some implementations described herein provide techniques and apparatuses for the substrate for the full-bridge device and the substrate for the LLC device to be bonded in a stack rather than connected (e.g., via wires). By bonding the full-bridge device and the LLC device in a stack rather than connecting the devices, a chip area associated with the power converter is reduced. Additionally, the full-bridge device and the LLC device consume less power because parasitic inductance and capacitance are reduced. Finally, bonding the full-bridge device and the LLC device in a stack conserves raw materials and production time that would otherwise have been used to connect the full-bridge device and the LLC device (e.g., via wires).

Alternatively, some implementations described herein provide techniques and apparatuses for forming the full-bridge device and the LLC device on a single substrate rather than connecting them (e.g., via wires). As a result, a chip area associated with the power converter is reduced. Additionally, the full-bridge device and the LLC device consume less power because parasitic inductance and capacitance are reduced. Finally, forming the full-bridge device and the LLC device on a same substrate conserves raw materials and production time that would otherwise have been used to connect the full-bridge device and the LLC device (e.g., via wires).

FIG. 1 is a diagram of an example environment 100 in which systems and/or methods described herein may be implemented. As shown in FIG. 1, environment 100 may include a plurality of semiconductor processing tool sets 105-150 and a transport tool set 155. The plurality of semiconductor processing tool sets 105-150 may include a redistribution layer (RDL) tool set 105, a planarization tool set 110, an interconnect tool set 115, a deposition tool 120, an exposure tool 125, a developer tool 130, an etch tool 135, a printed circuit board (PCB) tool set 140, a surface mount (SMT) tool set 145, and a finished goods tool set 150. The semiconductor processing tool sets 105-150 of example environment 100 may be included in one or more facilities, such as a semiconductor clean or semi-clean room, a semiconductor foundry, a semiconductor processing facility, an outsourced assembly and test (OSAT) facility, and/or a manufacturing facility, among other examples.

In some implementations, the semiconductor processing tool sets 105-150, and operations performed by the semiconductor processing tool sets 105-150, are distributed across multiple facilities. Additionally, or alternatively, one or more of the semiconductor processing tool sets 105-150 may be subdivided across the multiple facilities. Sequences of operations performed by the semiconductor processing tool sets 105-150 may vary based on a type of the semiconductor package or a state of completion of the semiconductor package.

One or more of the semiconductor processing tool sets 105-150 may perform a series of operations to assemble a semiconductor package (e.g., attach one or more IC dies to a substrate, where the substrate provides an external connectivity to a computing device, among other examples). Additionally, or alternatively, one or more of the semiconductor processing tool sets 105-150 may perform a series of operations to ensure a quality and/or a reliability of the semiconductor package (e.g., test and sort the one or more IC dies, and/or the semiconductor package, at various stages of manufacturing).

The semiconductor package may correspond to a type of semiconductor package. For example, the semiconductor package may correspond to a flipchip (FC) type of semiconductor package, a ball grid array (BGA) type of semiconductor package, a multi-chip package (MCP) type of semiconductor package, or a chip scale package (CSP) type of semiconductor package. Additionally, or alternatively, the semiconductor package may correspond to a plastic leadless chip carrier (PLCC) type of semiconductor package, a system-in-package (SIP) type of semiconductor package, a ceramic leadless chip carrier (CLCC) type of semiconductor package, or a thin small outline package (TSOP) type of semiconductor package, among other examples.

The RDL tool set 105 includes one or more tools capable of forming one or more layers and patterns of materials (e.g., dielectric layers, conductive redistribution layers, and/or vertical interconnect access structures (vias), among other examples) on a semiconductor substrate (e.g., a semiconductor wafer, among other examples). The RDL tool set 105 may include a combination of one or more photolithography tools (e.g., a photolithography exposure tool, a photoresist dispense tool, a photoresist develop tool, among other examples), a combination of one or more etch tools (e.g., a plasma-based etched tool, a dry-etch tool, or a wet-etch tool, among other examples), and one or more deposition tools (e.g., a chemical vapor deposition (CVD) tool, a physical vapor deposition (PVD) tool, an atomic layer deposition (ALD) tool, a spin coating tool, and/or a plating tool, among other examples). The RDL tool set 105 may further include a bonding/debonding tool for joining, and/or separating, semiconductor substrates (e.g., semiconductor wafers). In some implementations, the example environment 100 includes a plurality of types of such tools as part of RDL tool set 105.

The planarization tool set 110 includes one or more tools that are capable of polishing or planarizing various layers of the semiconductor substrate (e.g., the semiconductor wafer). The planarization tool set 110 may also include tools capable of thinning the semiconductor substrate. The planarization tool set 110 may include a chemical mechanical planarization (CMP) tool or a lapping tool, among other examples. In some implementations, the example environment 100 includes a plurality of types of such tools as part of the planarization tool set 110.

The interconnect tool set 115 includes one or more tools that are capable of forming interconnect structures (e.g., electrically-conductive structures) as part of the semiconductor package. The interconnect structures formed by the interconnect tool set 115 may include a wire, a stud, a pillar, a bump, or a solderball, among other examples. The interconnect structures formed by the interconnect tool set 115 may include materials such as a gold (Au) material, a copper (Cu) material, a silver (Ag) material, a nickel (Ni) material, a tin (Sn) material, or a palladium (Pd) material, among other examples. The interconnect tool set 115 may include a bumping tool, a wirebond tool, or a plating tool, among other examples. In some implementations, the example environment 100 includes a plurality of types of such tools as part of the interconnect tool set 115.

The deposition tool 120 is a semiconductor processing tool that includes a semiconductor processing chamber and one or more devices capable of depositing various types of materials onto a substrate. In some implementations, the deposition tool 120 includes a spin coating tool that is capable of depositing a photoresist layer on a substrate such as a wafer. In some implementations, the deposition tool 120 may include a chemical vapor deposition (CVD) tool, such as a plasma-enhanced CVD (PECVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 120 includes a physical vapor deposition (PVD) tool, such as a sputtering tool or another type of PVD tool. In some implementations, the example environment 100 includes a plurality of types of deposition tools 120.

The exposure tool 125 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or another type of exposure tool. The exposure tool 125 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 125 includes a scanner, a stepper, or a similar type of exposure tool.

The developer tool 130 is a semiconductor processing tool that is capable of developing a photoresist layer that has been exposed to a radiation source to develop a pattern transferred to the photoresist layer from the exposure tool 125. In some implementations, the developer tool 130 develops a pattern by removing unexposed portions of a photoresist layer. In some implementations, the developer tool 130 develops a pattern by removing exposed portions of a photoresist layer. In some implementations, the developer tool 130 develops a pattern by dissolving exposed or unexposed portions of a photoresist layer through the use of a chemical developer.

The etch tool 135 is a semiconductor processing tool that is capable of etching various types of materials of a substrate, wafer, or semiconductor device. For example, the etch tool 135 may include a wet etch tool, a dry etch tool, and/or another type of etch tool. In some implementations, the etch tool 135 includes a chamber that is filled with an etchant, and the substrate is placed in the chamber for a particular time period to remove particular amounts of one or more portions of the substrate. In some implementations, the etch tool 135 etches one or more portions of the substrate using a plasma etch or a plasma-assisted etch, which may involve using an ionized gas to isotropically or directionally etch the one or more portions.

The PCB tool set 140 incudes one or more tools that are capable of forming a PCB having one or more layers of electrically-conductive traces. The PCB tool set 140 may form a type of PCB, such as a single layer PCB, a multi-layer PCB, or a high density interconnect (HDI) PCB, among other examples. In some implementations, the PCB tool set 140 forms an interposer and/or a substrate. The PCB tool set 140 may include a laminating tool, a plating tool, a photo-engraving tool, a laser cutting tool, a pick-and-place tool, an etching tool, a dispense tool, and/or a curing tool (e.g., a furnace) among other examples. In some implementations, the example environment 100 includes a plurality of types of such tools as part of the PCB tool set 140.

The SMT tool set 145 includes one or more tools that are capable of mounting the semiconductor package to a circuit board (e.g., a central processing unit (CPU) PCB, a memory module PCB, an automotive circuit board, and/or a display system board, among other examples). The SMT tool set 145 may include a stencil tool, a solder paste printing tool, a pick-and-place tool, a reflow tool (e.g., a furnace), and/or an inspection tool, among other examples. In some implementations, the example environment 100 includes a plurality of types of such tools as part of the SMT tool set 145.

The finished goods tool set 150 includes one or more tools that are capable of preparing a final product including the semiconductor package for shipment to a customer. The finished goods tool set 150 may include a tape-and-reel tool, a pick-and-place tool, a carrier tray stacking tool, a boxing tool, a drop-testing tool, a carousel tool, a controlled-environment storage tool, and/or a sealing tool, among other examples. In some implementations, the example environment 100 includes a plurality of types of such tools as part of the finished goods tool set 150.

The transport tool set 155 includes one or more tools that are capable of transporting work-in-process (WIP) between the semiconductor processing tools 105-150. The transport tool set 155 may be configured to accommodate one or more transport carriers such a wafer transport carrier (e.g., a wafer cassette or a front opening unified pod (FOUP), among other examples), a die carrier transport carrier (e.g., a film frame, among other examples), and/or a package transport carrier (e.g., a joint electron device engineering (JEDEC) tray or a carrier tape reel, among other examples). The transport tool set 155 may also be configured to transfer and/or combine WIP amongst transport carriers. The transport tool set 155 may include a pick-and-place tool, a conveyor tool, a robot arm tool, an overhead hoist transport (OHT) tool, an automated materially handling system (AMHS) tool, and/or another type of tool. In some implementations, the example environment 100 includes a plurality of types of such tools as part of the transport tool set 155.

One or more of the semiconductor processing tool sets 105-150 may perform a series of operations. For example, and as described in greater detail in connection with FIGS. 4A-4F, FIGS. 5A-5F, and elsewhere herein, the series of operations may include forming a first gate over a first substrate for driving a first drain associated with a full-bridge device for converting alternating current to direct current and forming a second gate over a second substrate for driving a second drain associated with an LLC device for reducing a voltage of the direct current. The series of operations may further include bonding the second substrate and the first substrate together to form an integrated device and forming a plurality of RDLs connected to the first drain, the second drain, and sources associated with the first drain and the second drain.

Alternatively, and as described in greater detail in connection with FIGS. 6A-6E and elsewhere herein, the series of operations may include forming a first gate over a first portion of a substrate for driving a first drain associated with a full-bridge device for converting alternating current to direct current and forming a second gate over a second portion of the substrate for driving a second drain associated with an LLC for reducing a voltage of the direct current. The series of operations may further include forming one or more isolations structures to isolate the first gate from the second gate and forming a plurality of RDLs connected to the first drain, the second drain, and sources associated with the first drain and the second drain.

The number and arrangement of tool sets shown in FIG. 1 are provided as one or more examples. In practice, there may be additional tool sets, different tool sets, or differently arranged tool sets than those shown in FIG. 1. Furthermore, two or more tool sets shown in FIG. 1 may be implemented within a single tool set, or a tool set shown in FIG. 1 may be implemented as multiple, distributed tool sets. Additionally, or alternatively, one or more tool sets of environment 100 may perform one or more functions described as being performed by another tool set of environment 100.

Figure 2A:
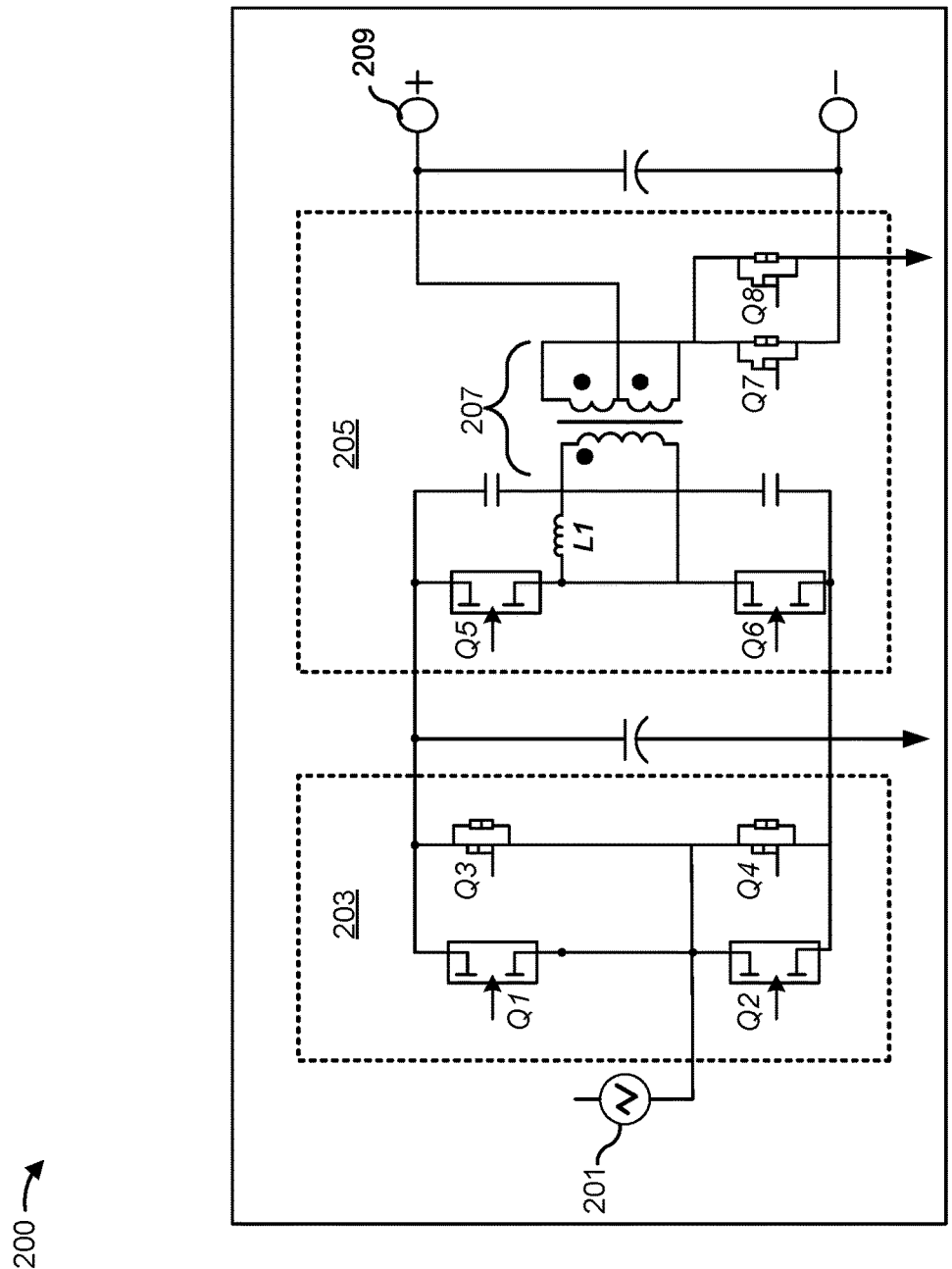
FIGS. 2A-2B are diagrams of an example full-bridge device described herein.
Figure 2B:
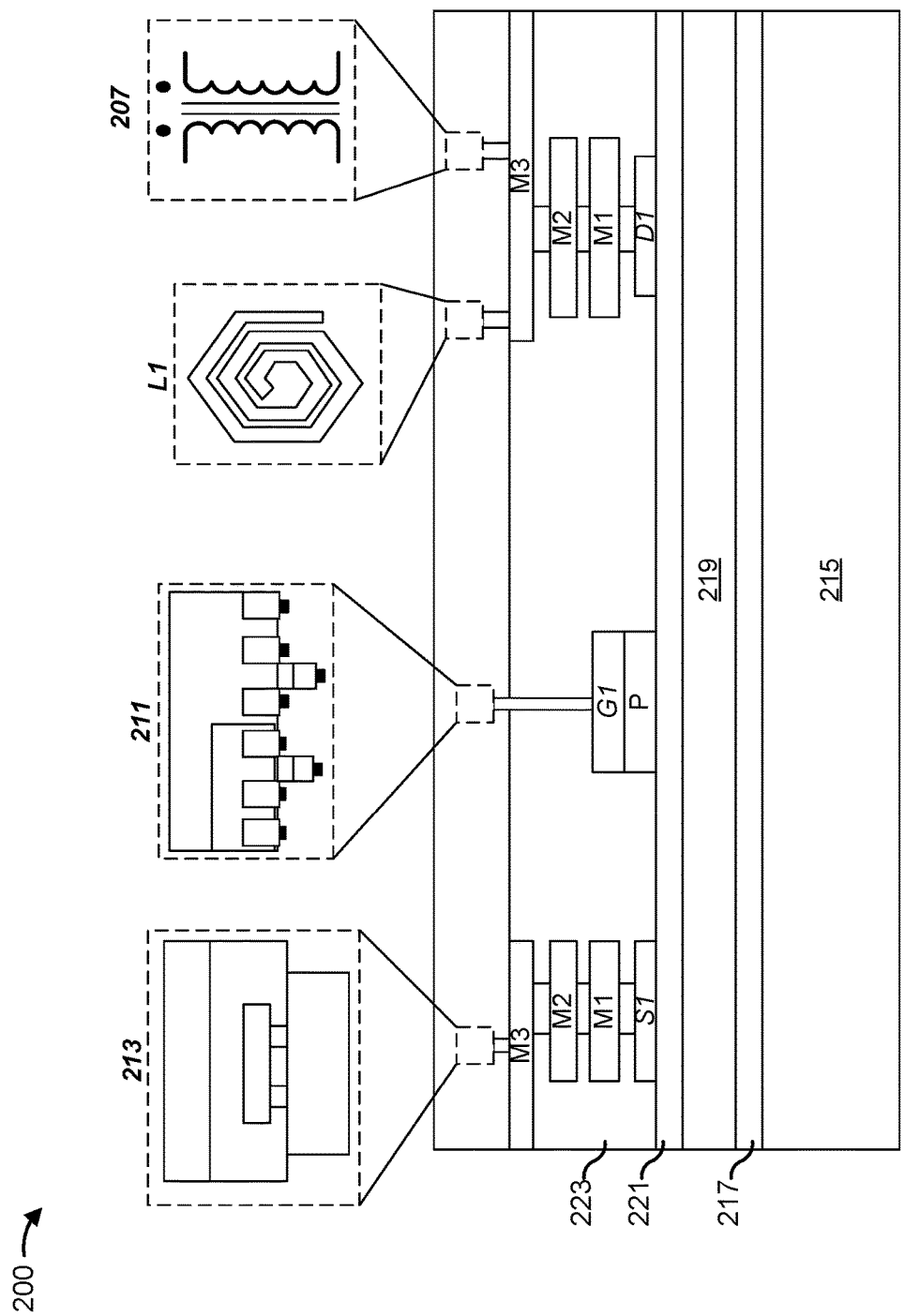

FIGS. 2A-2B are diagrams of an example full-bridge device 200 described herein. In some implementations, the full-bridge device 200 may convert an AC of 208 Volts (V) to a DC of 4000 V and further downconvert the DC to 48 V. FIG. 2A represents a circuit diagram corresponding to the full-bridge device 200.

As shown in FIG. 2A, the full-bridge device 200 may include an input connection 201 for receiving the AC. The input connection 201 may feed the AC to a totem-pole power factor correction (PFC) 203 that includes one or more transistors (e.g., transistors Q1, Q2, Q3, and Q4 in FIG. 2A). The totem-pole PFC 203 may convert the AC to DC and feed the DC to a resonant downconverter 205 that includes one or more transistors (e.g., transistors Q5, Q6, Q7, and Q8 in FIG. 2A) and an inductor L1. Additionally, the resonant downconverter 205 may include a transformer 207 before an output connection 209. The resonant downconverter 205 may downconvert the DC and feed the downconverted DC to the output connection 209.

FIG. 2B shows a side view of the full-bridge device 200. As shown in FIG. 2B, the transistors of the full-bridge device 200 may be driven by a gate G1 formed on a P layer (e.g., a p-type doped material). In some implementations, the gate G1 is a complementary metal-oxide-semiconductor (CMOS) gate 211. The gate G1 drives current between a source S1 and a drain D1. The source S1 is connected to a metal-insulator-metal (MIM) diode 213 through one or more metallization layers (e.g., layers M1, M2, and M3). The drain D1 is connected to the inductor L1 and the transformer 207 of the full-bridge device 200 through one or more metallization layers (e.g., layers M1, M2, and M3).

As further shown in FIG. 2B, the gate G1, the source S1, and the drain D1 are formed over a substrate 215 (e.g., formed of silicon (Si)). Additionally, an etch stop layer (ESL) 219 (e.g., formed of aluminum nitride (AlN)) may separate the substrate 215 from active layers. For example, the active layers may include layers 219 and 221 (e.g., formed of gallium nitride (GaN) and aluminum gallium nitride (AlGaN) respectively) that support a dielectric layer 223 with the source S1, the gate G1, and the drain D1.

As indicated above, FIGS. 2A-2B are provided as an example. Other examples may differ from what is described with regard to FIGS. 2A-2B.

Figure 3A:
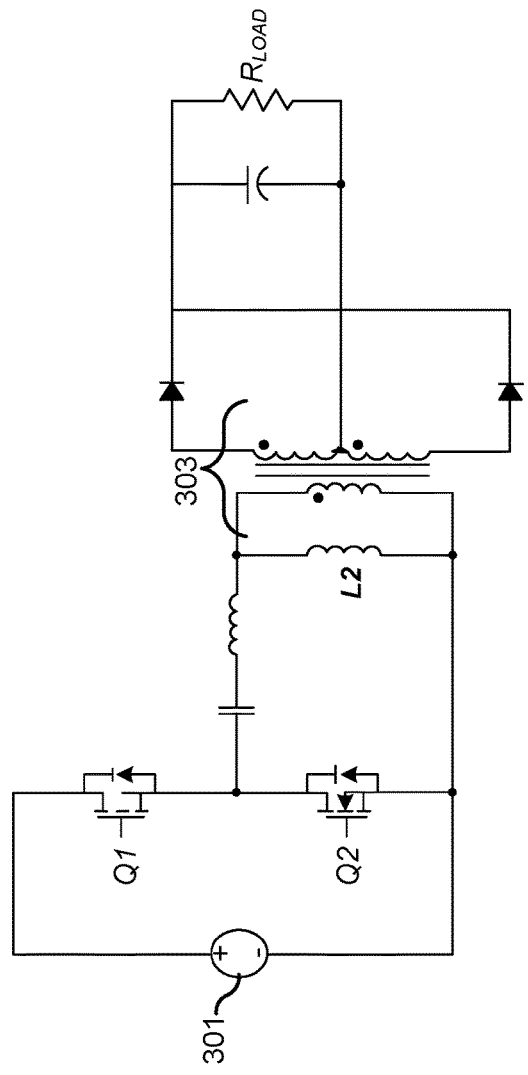
FIGS. 3A-3B are diagrams of an example inductor-inductor-capacitor device described herein.
Figure 3B:
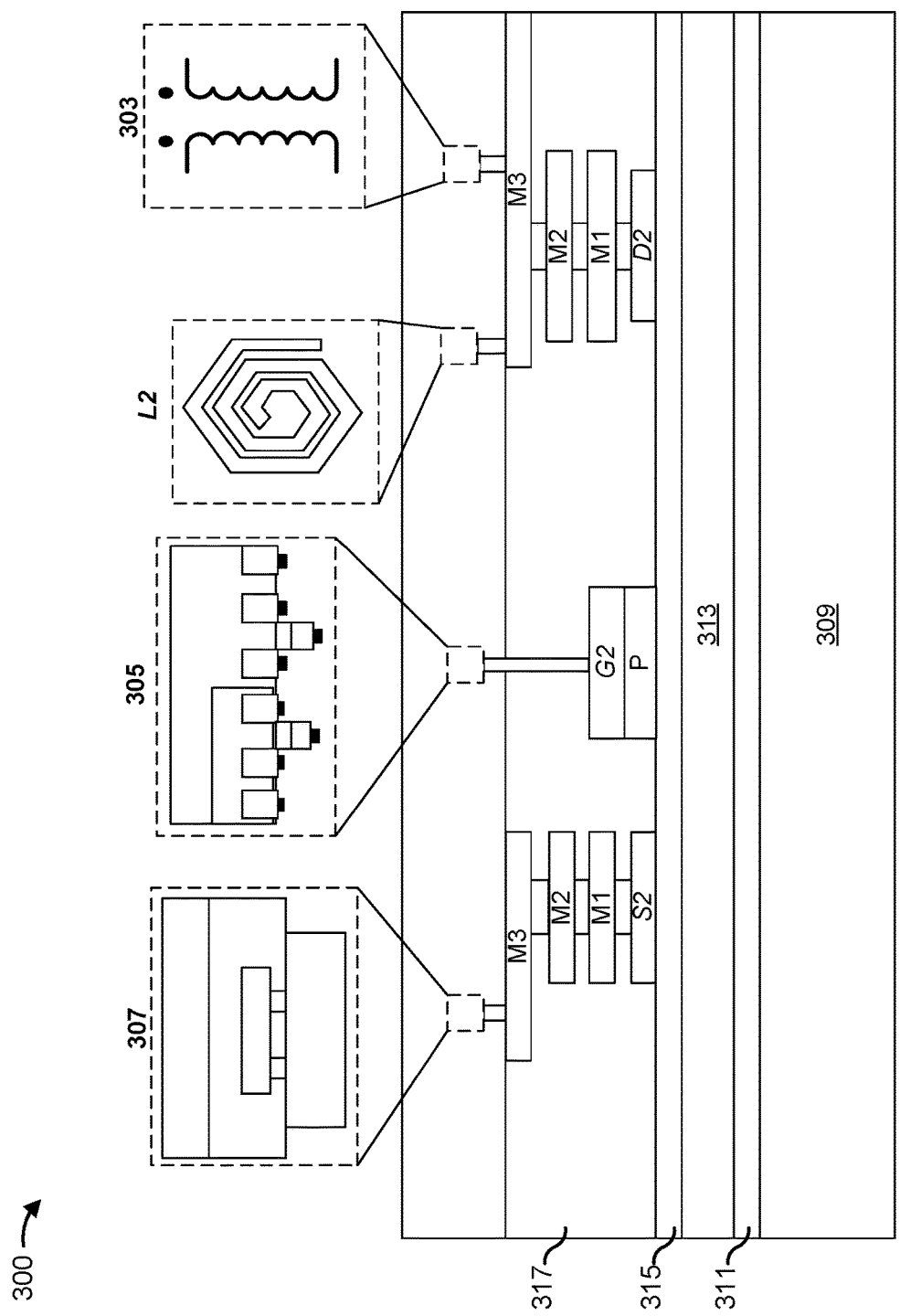

FIGS. 3A-3B are diagrams of an example LLC device 300 described herein. In some implementations, the LLC device 300 may downconvert a DC of 48 V to a DC of 12 V or 5 V (e.g., depending on implementation). FIG. 3A represents a circuit diagram corresponding to the LLC device 300.

As shown in FIG. 3A, the LLC device may include an input connection 301 for receiving the DC. The input connection 301 may feed the DC through one or more transistors (e.g., transistors Q1 and Q2 in FIG. 3A) and an inductor L2. Additionally, the LLC device 300 may include a transformer 303 before an output connection (e.g., near a resistor $R_{LOAD}$ in FIG. 3A). The LLC device 300 may therefore downconvert the DC and feed the downconverted DC to the output connection.

FIG. 3B shows a side view of the LLC device 300. As shown in FIG. 3B, the transistors of the LLC device 300 may be driven by a gate G2 formed on a P layer (e.g., a p-type doped material). In some implementations, the gate G2 is a CMOS gate 305. The gate G2 drives current between a source S2 and a drain D2. The source S2 is connected to an MIM diode 307 through one or more metallization layers (e.g., layers M1, M2, and M3). The drain D2 is connected to the inductor L2 and the transformer 303 of the LLC device 300 through one or more metallization layers (e.g., layers M1, M2, and M3).

As further shown in FIG. 3B, the gate G2, the source S2, and the drain D2 are formed over a substrate 309 (e.g., formed of silicon (Si)). Additionally, an ESL 311 (e.g., formed of aluminum nitride (AlN)) may separate the substrate 309 from active layers. For example, the active layers may include layers 313 and 315 (e.g., formed of gallium nitride (GaN) and aluminum gallium nitride (AlGaN) respectively) that support a dielectric layer 317 with the source S2, the gate G2, and the drain D2.

Combining the full-bridge device 200 and the LLC device 300 in a stack or on a single substrate, as described herein, reduces a chip area associated with an integrated device including the full-bridge device 200 and the LLC device 300. Additionally, parasitic inductance and capacitance are reduced and raw materials and production time are conserved that would otherwise have been used to connect the full-bridge device 200 and the LLC device 300 (e.g., via wires).

As indicated above, FIGS. 3A-3B are provided as an example. Other examples may differ from what is described with regard to FIGS. 3A-3B.

FIGS. 4A-4F are diagrams of an example implementation 400 described herein. Example implementation 400 may be used to form an integrated device including a full-bridge device 200 and an LLC device 300.

Figure 4A:
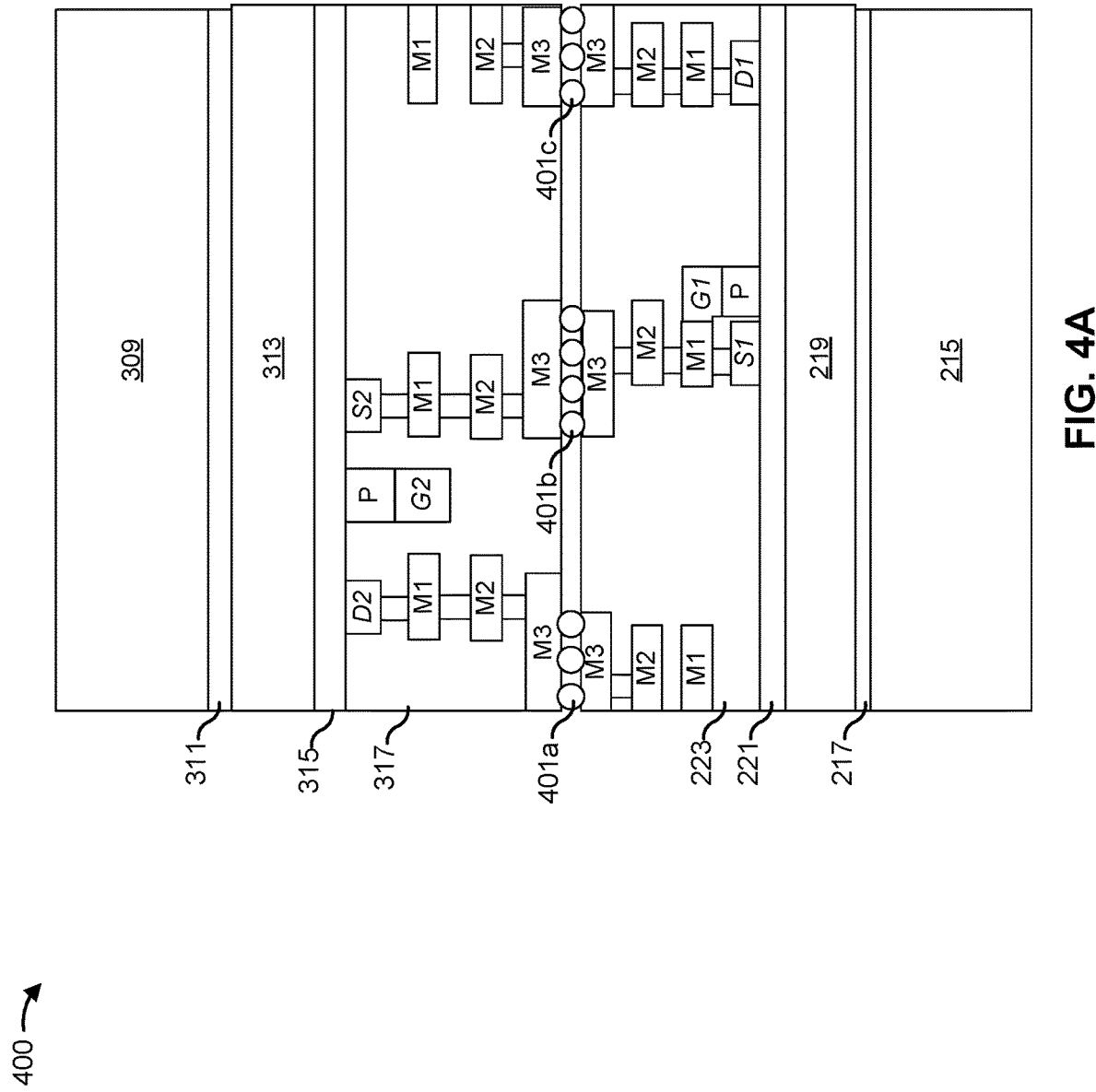
FIGS. 4A-4F are diagrams of an example implementation described herein.

As shown in FIG. 4A, the gate G1, the source S1, and the drain D1 for the full-bridge device 200 may be formed in a dielectric layer 223 over a substrate 215. For example, the deposition tool 120 may form a photoresist layer on the dielectric layer 223 (or on an ESL formed on the dielectric layer 223), the exposure tool 125 may expose the photoresist layer to a radiation source to pattern the photoresist layer, the developer tool 130 may develop and remove portions of the photoresist layer to expose the pattern, and the etch tool 135 may etch portions of the dielectric layer 223. In some implementations, a photoresist removal tool removes the remaining portions of the photoresist layer (e.g., using a chemical stripper, a plasma asher, and/or another technique) after the etch tool 135 etches the dielectric layer 223.

Accordingly, the deposition tool 120 may form the gate G1, the source S1, and the drain D1. Similarly, the gate G2, the source S2, and the drain D2 for the LLC device 300 may be formed in a dielectric layer 317 over a substrate 309.

As further shown in FIG. 4A, the dielectric layers 223 and 317 may be bonded in order to form a stack for the integrated device. For example, the interconnect tool set 115 may form interconnect structures 401a, 401b, and 401c between metallization layers (e.g., M3 layers) of the full-bridge device 200 and the LLC device 300. As shown in FIG. 4A, the full-bridge device 200 may include one or more dummy metallization layers that connect to active metallization layers associated with the drain D2 of the LLC device 300. Similarly, the LLC device 300 may include one or more dummy metallization layers that connect to active metallization layers associated with the drain D1 of the full-bridge device. The metallization layers associated with the sources S1 and S2 may connect to each other.

The interconnect structures 401a, 401b, and 401c may include one or more combinations of a stud, a pillar, a bump, or a solder ball, among other examples. The interconnect structures 401a, 401b, and 401c may include one or more materials, such as a gold (Au) material, a copper (Cu) material, a silver (Ag) material, a nickel (Ni) material, a tin (Sn) material, a lead (Pb) material, or a palladium (Pd) material, among other examples. In some implementations, the one or more materials may be lead-free (e.g., Pb-free).

Figure 4B:
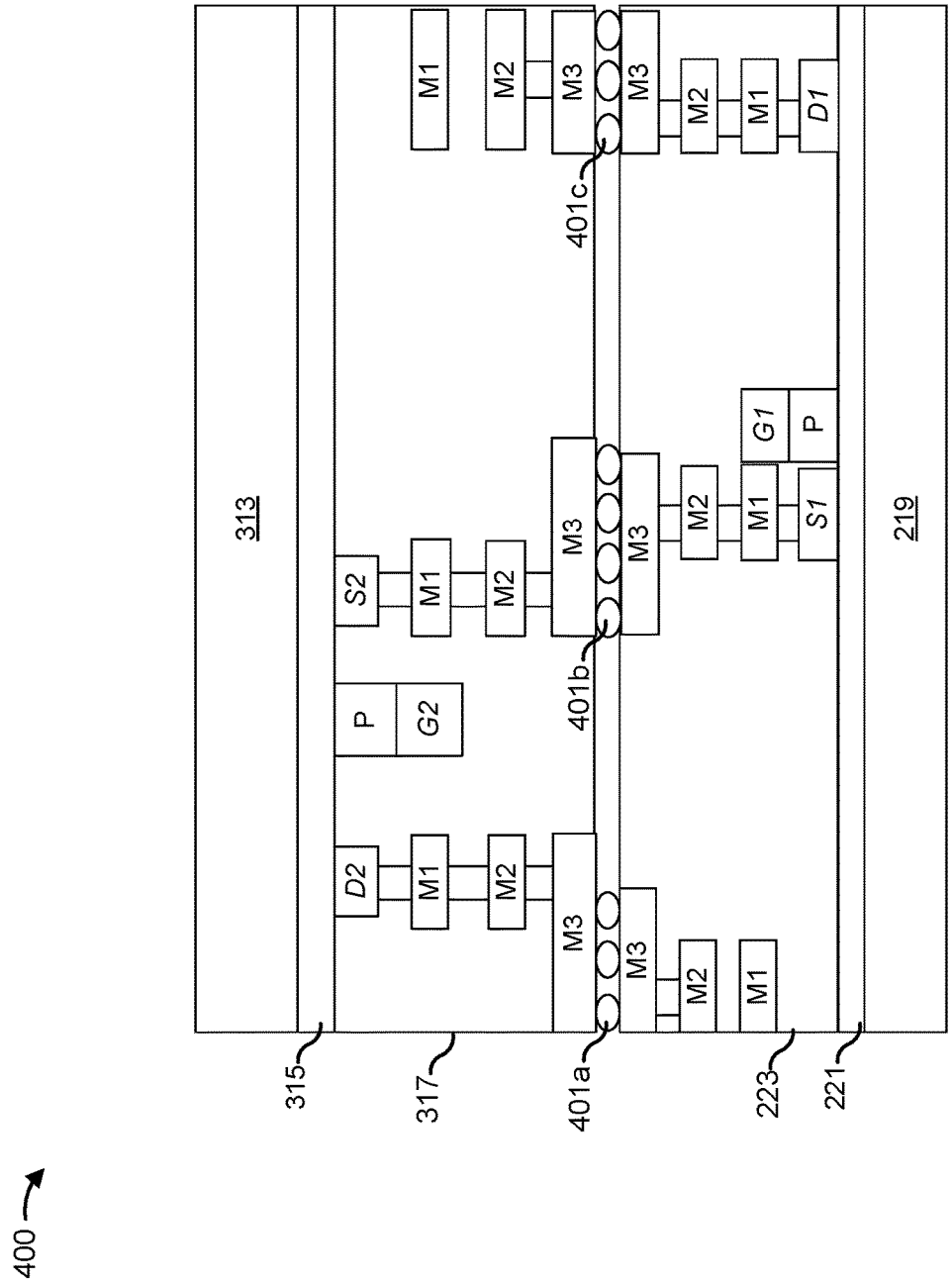

As shown in FIG. 4B, the substrate 215 and the corresponding ESL 217 may be removed. For example, the RDL tool set 105 may debond the substrate 215 to allow for formation of RDLs, as described below. Similarly, the substrate 309 and the corresponding ESL 311 may be removed.

Figure 4C:
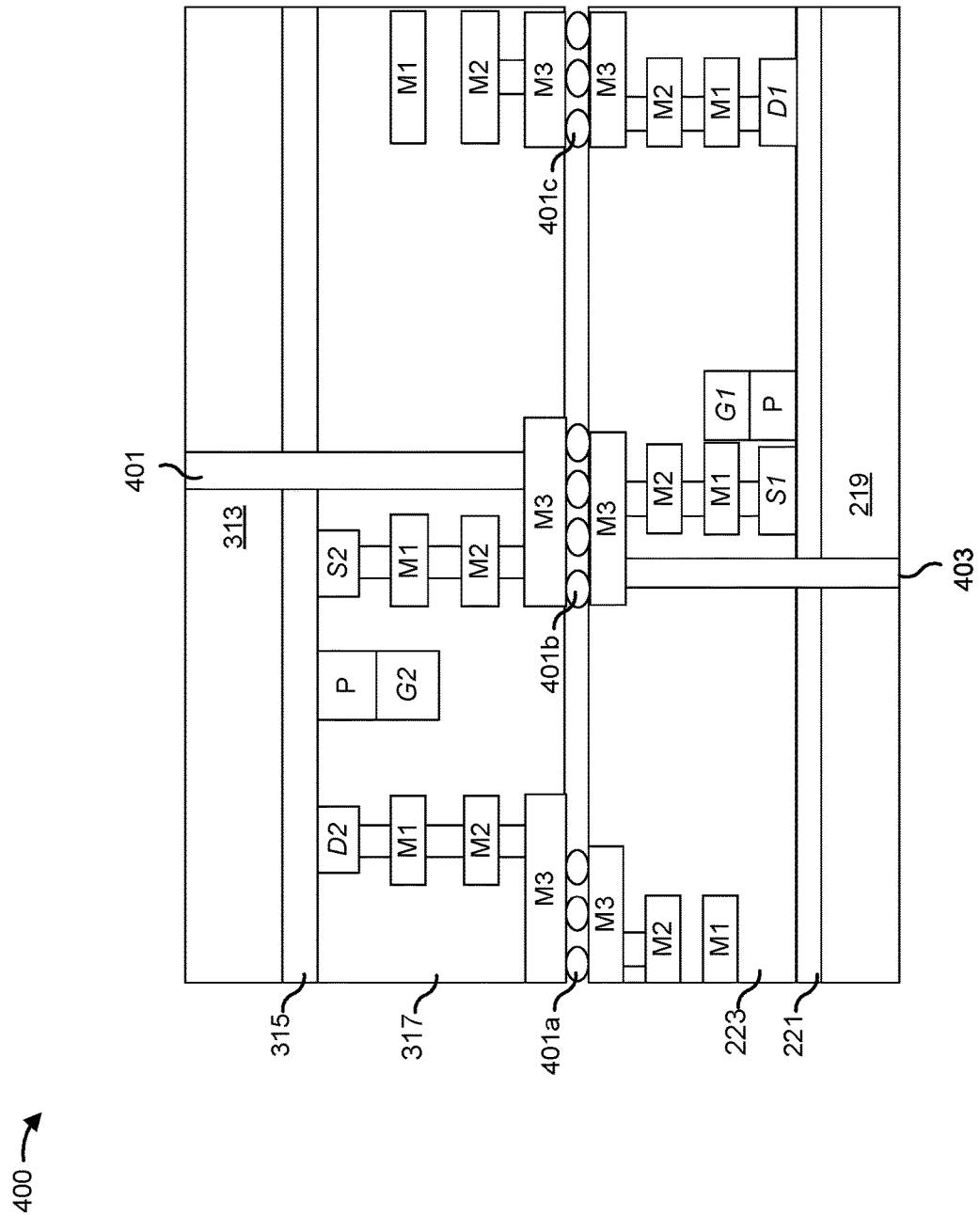

Accordingly, as shown in FIG. 4C, an interconnect 401 to a metallization layer M3 associated with the source S2 may be formed for the LLC device 300. For example, the interconnect 401 may pass through layers 313 and 315 and through the dielectric layer 317. In some implementations, the deposition tool 120 may form a photoresist layer on the layer 313, the exposure tool 125 may expose the photoresist layer to a radiation source to pattern the photoresist layer, the developer tool 130 may develop and remove portions of the photoresist layer to expose the pattern, and the etch tool 135 may etch portions of the layer 313. In some implementations, a photoresist removal tool removes the remaining portions of the photoresist layer (e.g., using a chemical stripper, a plasma asher, and/or another technique) after the etch tool 135 etches the layer 313. Similarly, an interconnect 403 to a metallization layer M3 associated with the source S1 may be formed for the full-bridge device 200. For example, the interconnect 403 may pass through layers 219 and 221 and through the dielectric layer 223.

Figure 4D:
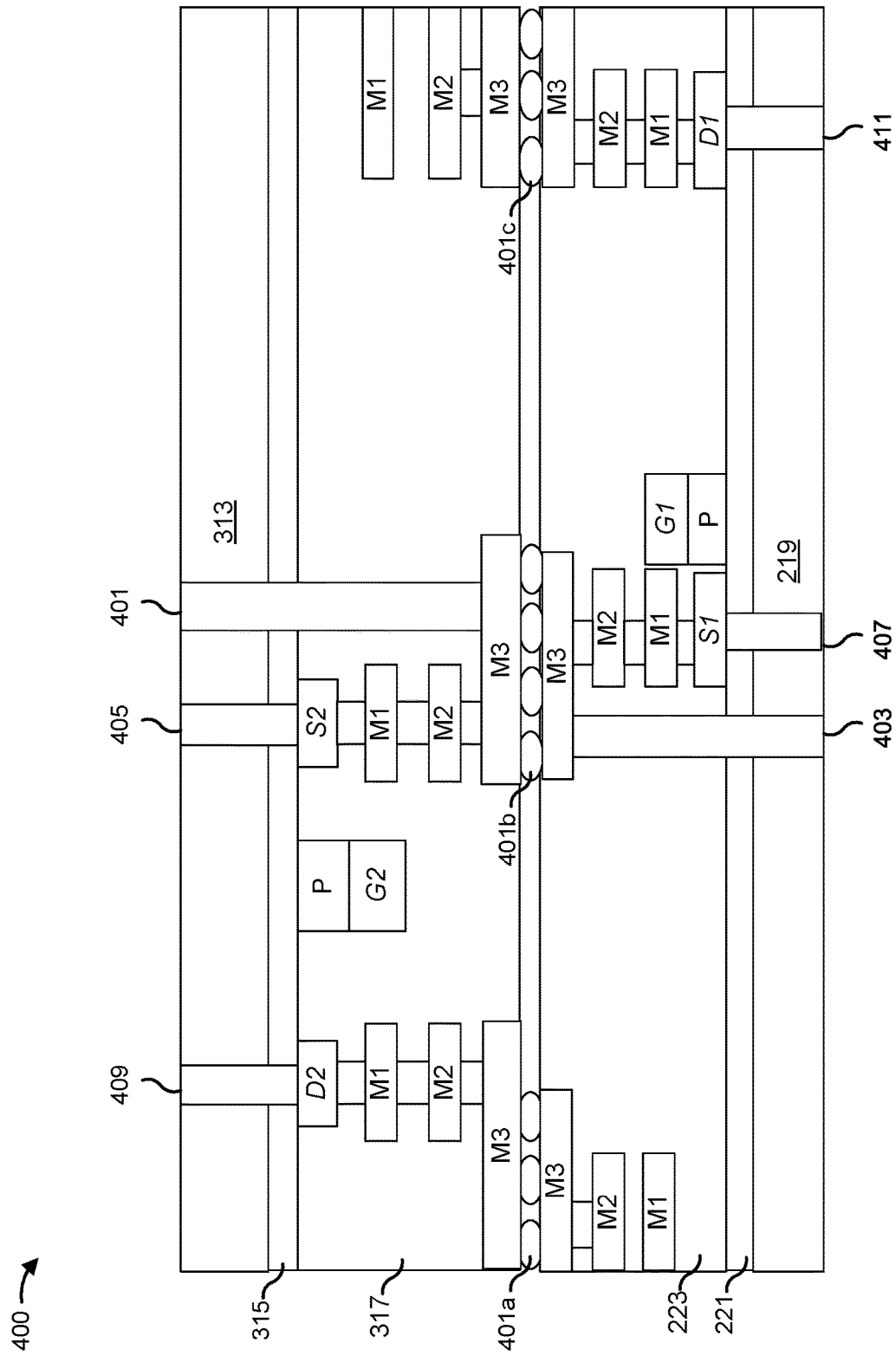

Further, as shown in FIG. 4D, an interconnect 405 to the source S2 and an interconnect 409 to the drain D2 may be formed for the LLC device 300. For example, the interconnects 405 and 409 may pass through layers 313 and 315. In some implementations, the deposition tool 120 may form a photoresist layer on the layer 313, the exposure tool 125 may expose the photoresist layer to a radiation source to pattern the photoresist layer, the developer tool 130 may develop and remove portions of the photoresist layer to expose the pattern, and the etch tool 135 may etch portions of the layer 313. In some implementations, a photoresist removal tool removes the remaining portions of the photoresist layer (e.g., using a chemical stripper, a plasma asher, and/or another technique) after the etch tool 135 etches the layer 313. Similarly, an interconnect 407 to the source S1 and an interconnect 411 to the drain D1 may be formed for the full-bridge device 200. For example, the interconnects 407 and 411 may pass through layers 219 and 221.

Figure 4E:
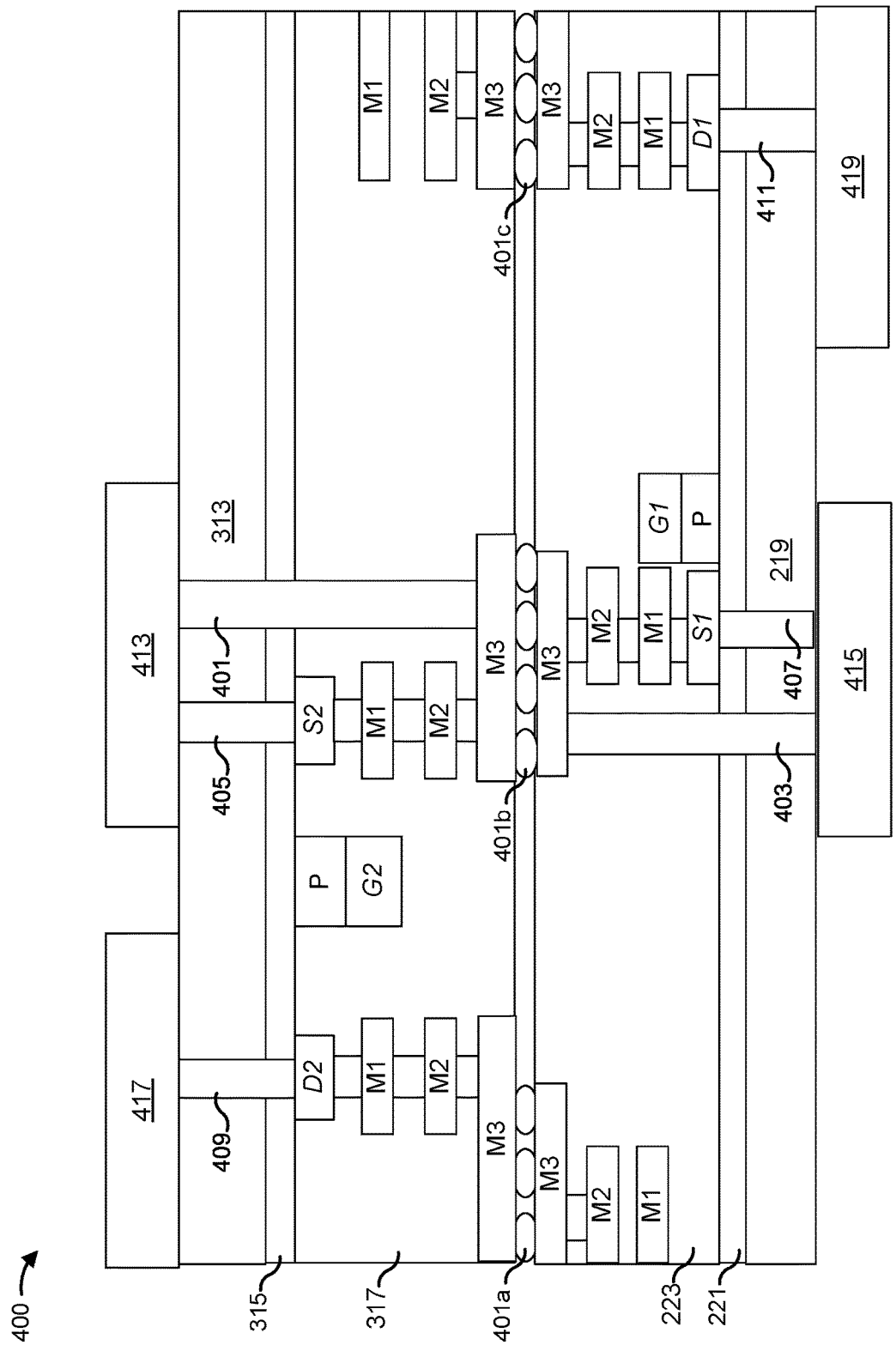

In some implementations, and as shown in FIG. 4E, RDLs 413 and 415 may be formed to connect to sources S1 and S2, and RDLs 417 and 419 may be formed to connect to drains D1 and D2. For example, the RDL tool set 105 may form the RDL 413 over the interconnects 401 and 405 and the RDL 415 over the interconnects 403 and 407. Similarly, the RDL tool set 105 may form the RDL 417 over the interconnect 409 and the RDL 419 over the interconnect 411. Accordingly, additional circuit components for the full-bridge device 200 may be formed over the RDLs 415 and 419. Similarly, additional circuit components for the LLC device 300 may be formed over the RDLs 413 and 417. As a result, chip area for the integrated device is reduced. Additionally, because the RDLs are on opposing sides of the integrated device, heat dissipation is increased because there is additional surface area of the integrated device in contact with a surrounding environment.

Figure 4F:
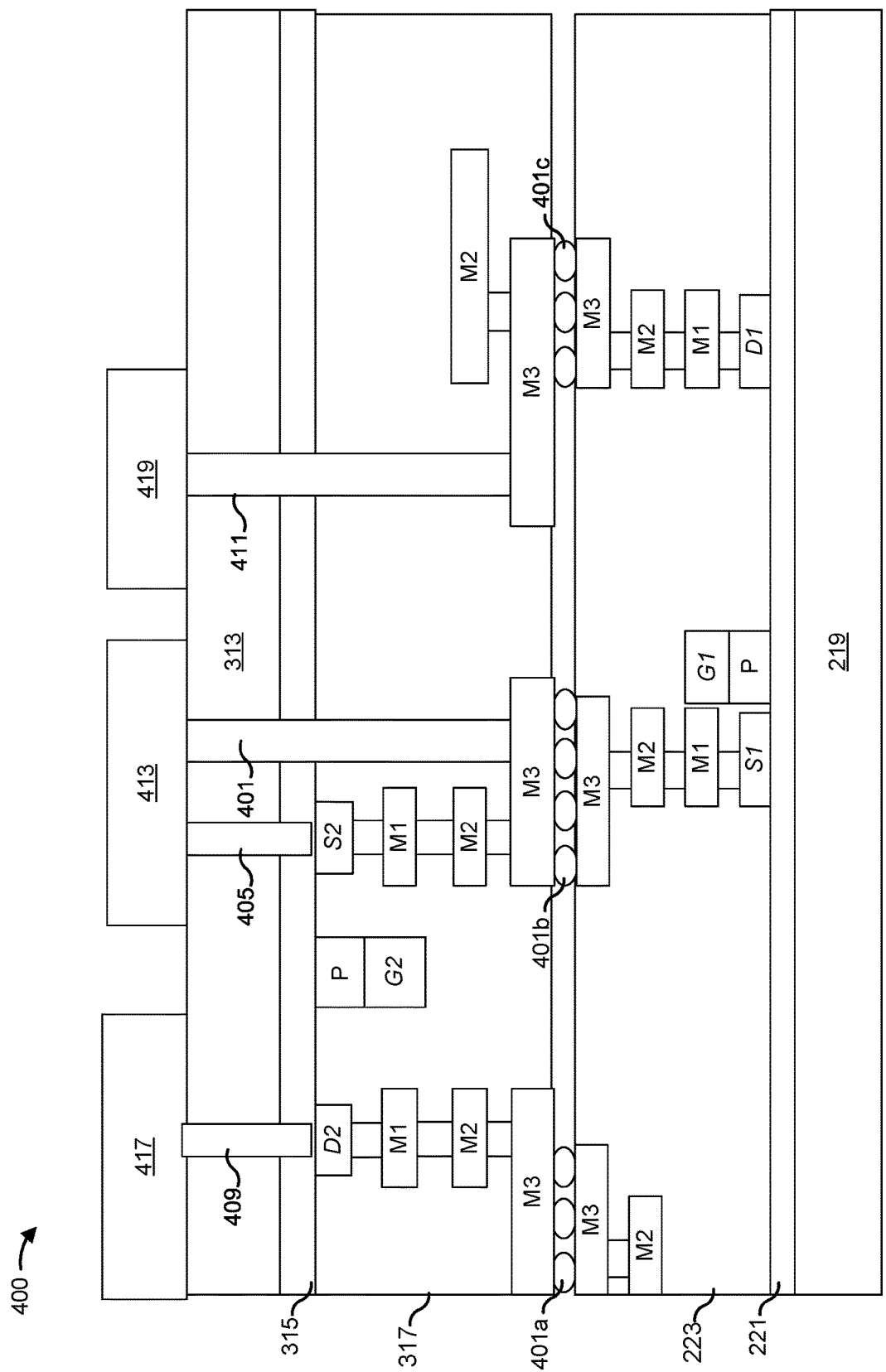

Alternatively, and as shown in FIG. 4F, the RDLs may be formed on a single side of the integrated device. Accordingly, the full-bridge device 200 and the LLC device 300 may use a same RDL 413 to connect to the sources S1 and S2. Additionally, the RDL 419 for the drain D1 may use a metallization layer M3 in the LLC device 300 to connect to the drain D1. As a result, manufacturing time is shortened because the integrated device is not flipped multiple times during processing.

As indicated above, FIGS. 4A-4F are provided as an example. Other examples may differ from what is described with regard to FIGS. 4A-4F.

FIGS. 5A-5F are diagrams of an example implementation 500 described herein. Example implementation 500 may be used to form an integrated device including a full-bridge device 200 and an LLC device 300.

Figure 5A:
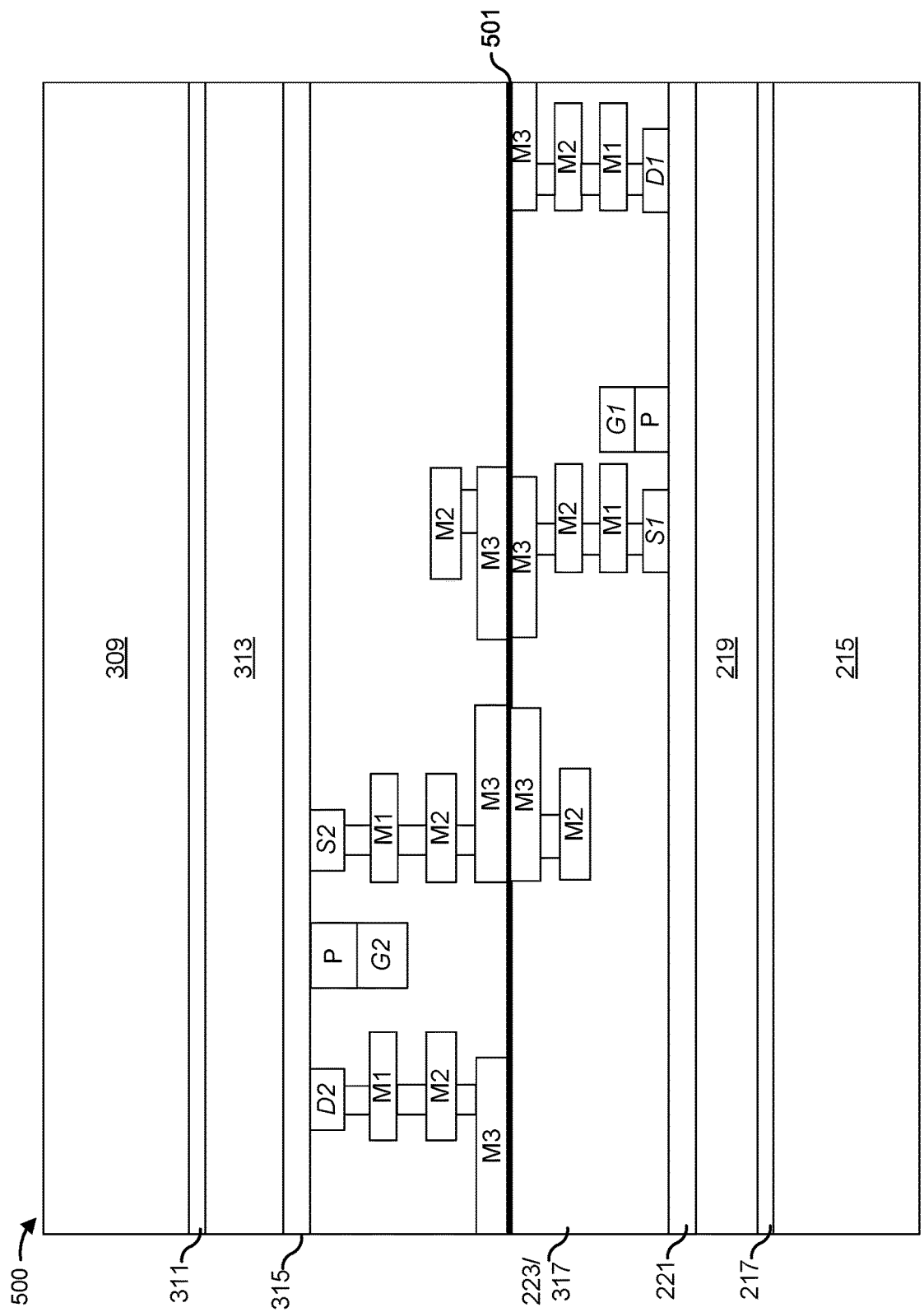
FIGS. 5A-5F are diagrams of an example implementation described herein.

As shown in FIG. 5A, the gate G1, the source S1, and the drain D1 for the full-bridge device 200 may be formed in a dielectric layer 223 over a substrate 215. For example, the deposition tool 120 may form a photoresist layer on the dielectric layer 223 (or on an ESL formed on the dielectric layer 223), the exposure tool 125 may expose the photoresist layer to a radiation source to pattern the photoresist layer, the developer tool 130 may develop and remove portions of the photoresist layer to expose the pattern, and the etch tool 135 may etch portions of the dielectric layer 223. In some implementations, a photoresist removal tool removes the remaining portions of the photoresist layer (e.g., using a chemical stripper, a plasma asher, and/or another technique) after the etch tool 135 etches the dielectric layer 223. Accordingly, the deposition tool 120 may form the gate G1, the source S1, and the drain D1. Similarly, the gate G2, the source S2, and the drain D2 for the LLC device 300 may be formed in a dielectric layer 317 over a substrate 309.

As further shown in FIG. 5A, the dielectric layers 223 and 317 may be bonded in order to form a stack for the integrated device. For example, the RDL tool set 105 may directly bond the dielectric layers 223 and 317 together. As shown in FIG. 5A, at least a first pad (e.g., a metallization layer M3) associated with the full-bridge device 200 may bond to a second pad (e.g., a corresponding metallization layer M3) associated with the LLC device 300. Accordingly, a copper-copper interface 501 is formed between the dielectric layers 223 and 317.

Additionally, at least some metallization layers (e.g., M3 layers) of the full-bridge device 200 and the LLC device 300 may be separated from each other physically and electrically. As a result, the full-bridge device 200 and the LLC device 300 may not include one or more dummy metallization layers, which conserves materials and reduces manufacturing time.

Figure 5B:
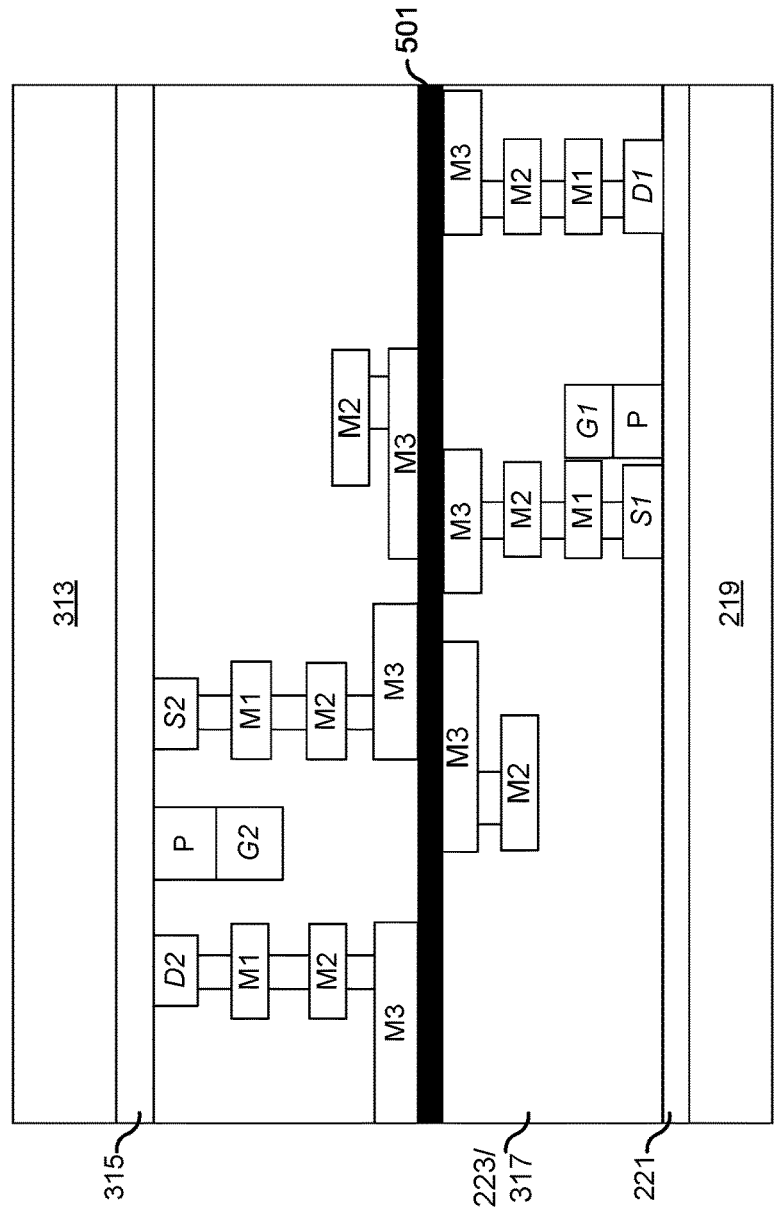

As shown in FIG. 5B, the substrate 215 and the corresponding ESL 217 may be removed. For example, the RDL tool set 105 may debond the substrate 215 to allow for formation of RDLs, as described below. Similarly, the substrate 309 and the corresponding ESL 311 may be removed.

Figure 5C:
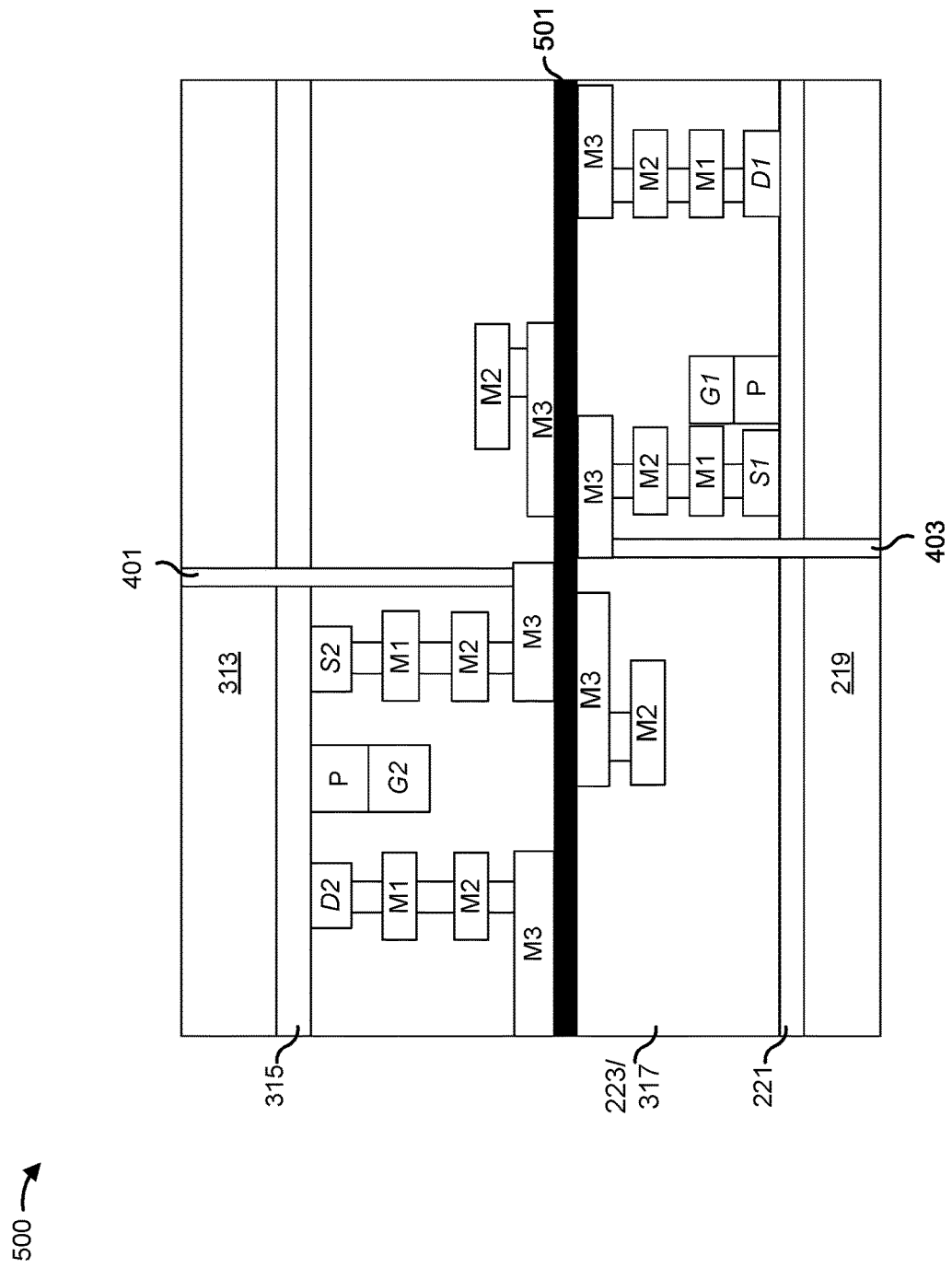

Accordingly, as shown in FIG. 5C, an interconnect 401 to a metallization layer M3 associated with the source S2 may be formed for the LLC device 300. For example, the interconnect 401 may pass through layers 313 and 315 and through the dielectric layer 317. In some implementations, the deposition tool 120 may form a photoresist layer on the layer 313, the exposure tool 125 may expose the photoresist layer to a radiation source to pattern the photoresist layer, the developer tool 130 may develop and remove portions of the photoresist layer to expose the pattern, and the etch tool 135 may etch portions of the layer 313. In some implementations, a photoresist removal tool removes the remaining portions of the photoresist layer (e.g., using a chemical stripper, a plasma asher, and/or another technique) after the etch tool 135 etches the layer 313. Similarly, an interconnect 403 to a metallization layer M3 associated with the source S1 may be formed for the full-bridge device 200. For example, the interconnect 403 may pass through layers 219 and 221 and through the dielectric layer 223.

Figure 5D:
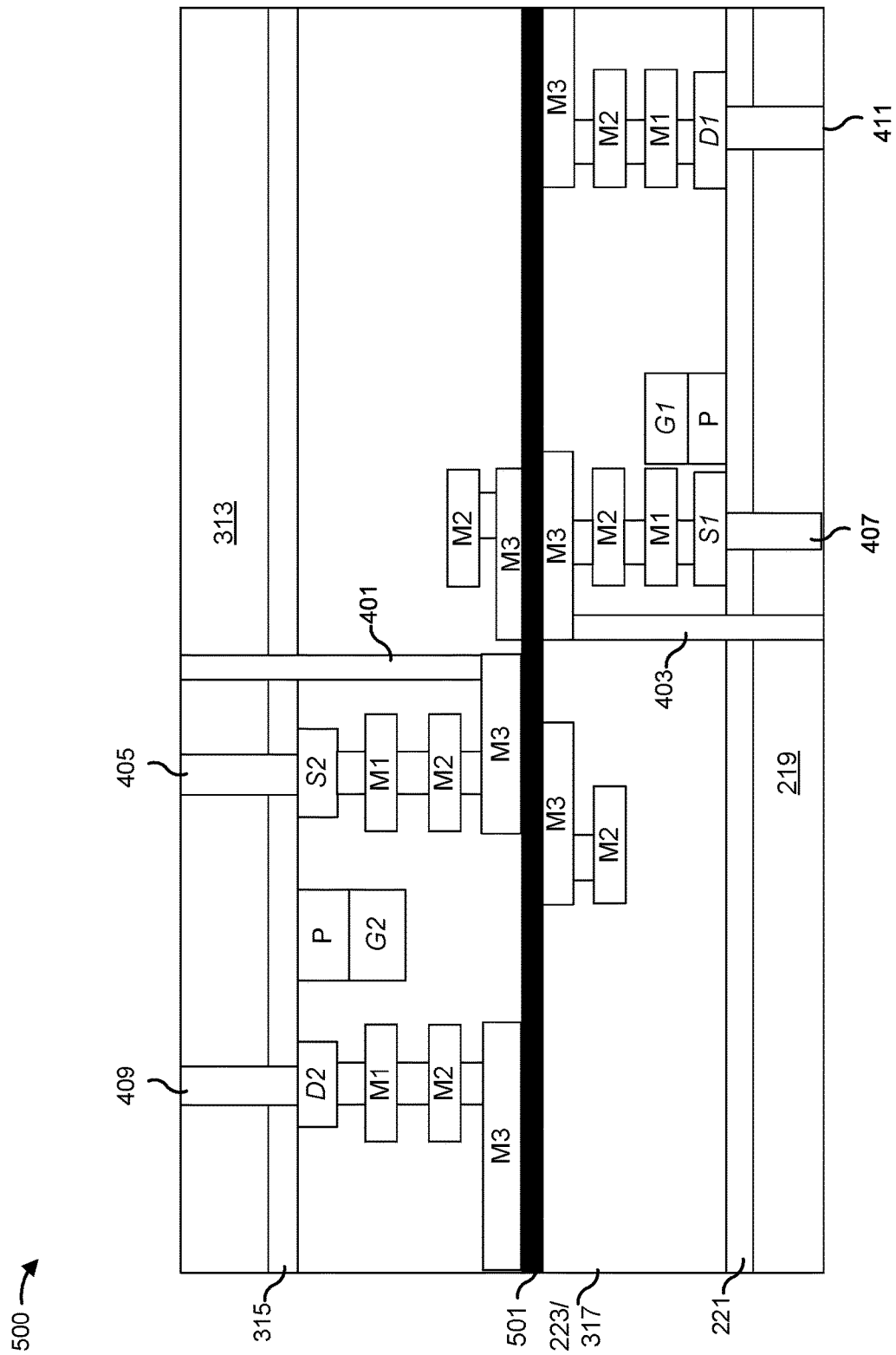

Further, as shown in FIG. 5D, an interconnect 405 to the source S2 and an interconnect 409 to the drain D2 may be formed for the LLC device 300. For example, the interconnects 405 and 409 may pass through layers 313 and 315. In some implementations, the deposition tool 120 may form a photoresist layer on the layer 313, the exposure tool 125 may expose the photoresist layer to a radiation source to pattern the photoresist layer, the developer tool 130 may develop and remove portions of the photoresist layer to expose the pattern, and the etch tool 135 may etch portions of the layer 313. In some implementations, a photoresist removal tool removes the remaining portions of the photoresist layer (e.g., using a chemical stripper, a plasma asher, and/or another technique) after the etch tool 135 etches the layer 313. Similarly, an interconnect 407 to the source S1 and an interconnect 411 to the drain D1 may be formed for the full-bridge device 200. For example, the interconnects 407 and 411 may pass through layers 219 and 221.

Figure 5E:
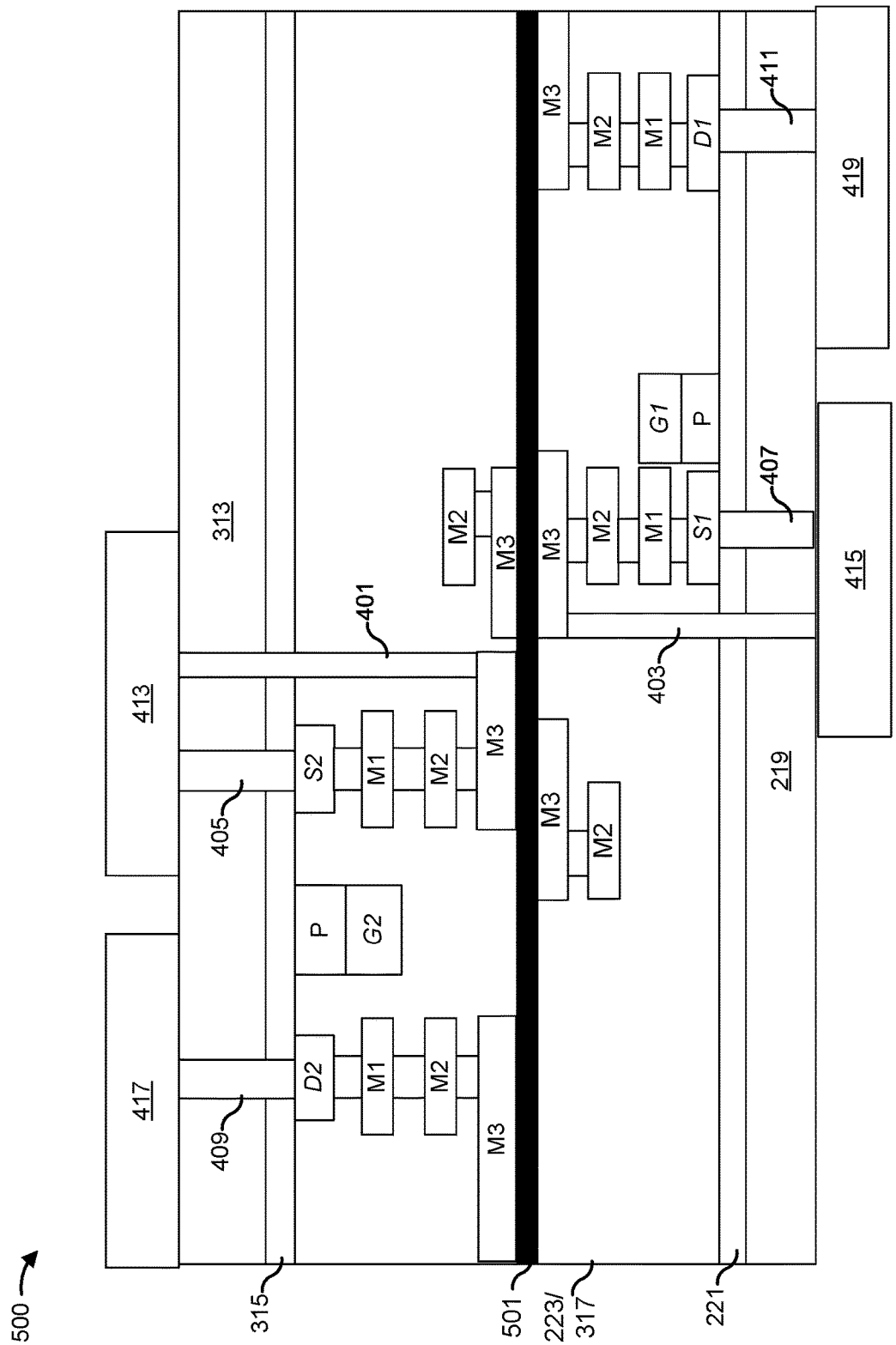

In some implementations, and as shown in FIG. 5E, RDLs 413 and 415 may be formed to connect to sources S1 and S2, and RDLs 417 and 419 may be formed to connect to drains D1 and D2. For example, the RDL tool set 105 may form the RDL 413 over the interconnects 401 and 405 and the RDL 415 over the interconnects 403 and 407. Similarly, the RDL tool set 105 may form the RDL 417 over the interconnect 409 and the RDL 419 over the interconnect 411. Accordingly, additional circuit components for the full-bridge device 200 may be formed over the RDLs 415 and 419. Similarly, additional circuit components for the LLC device 300 may be formed over the RDLs 413 and 417. As a result, chip area for the integrated device is reduced. Additionally, because the RDLs are on opposing sides of the integrated device, heat dissipation is increased because there is additional surface area of the integrated device in contact with a surrounding environment.

Figure 5F:
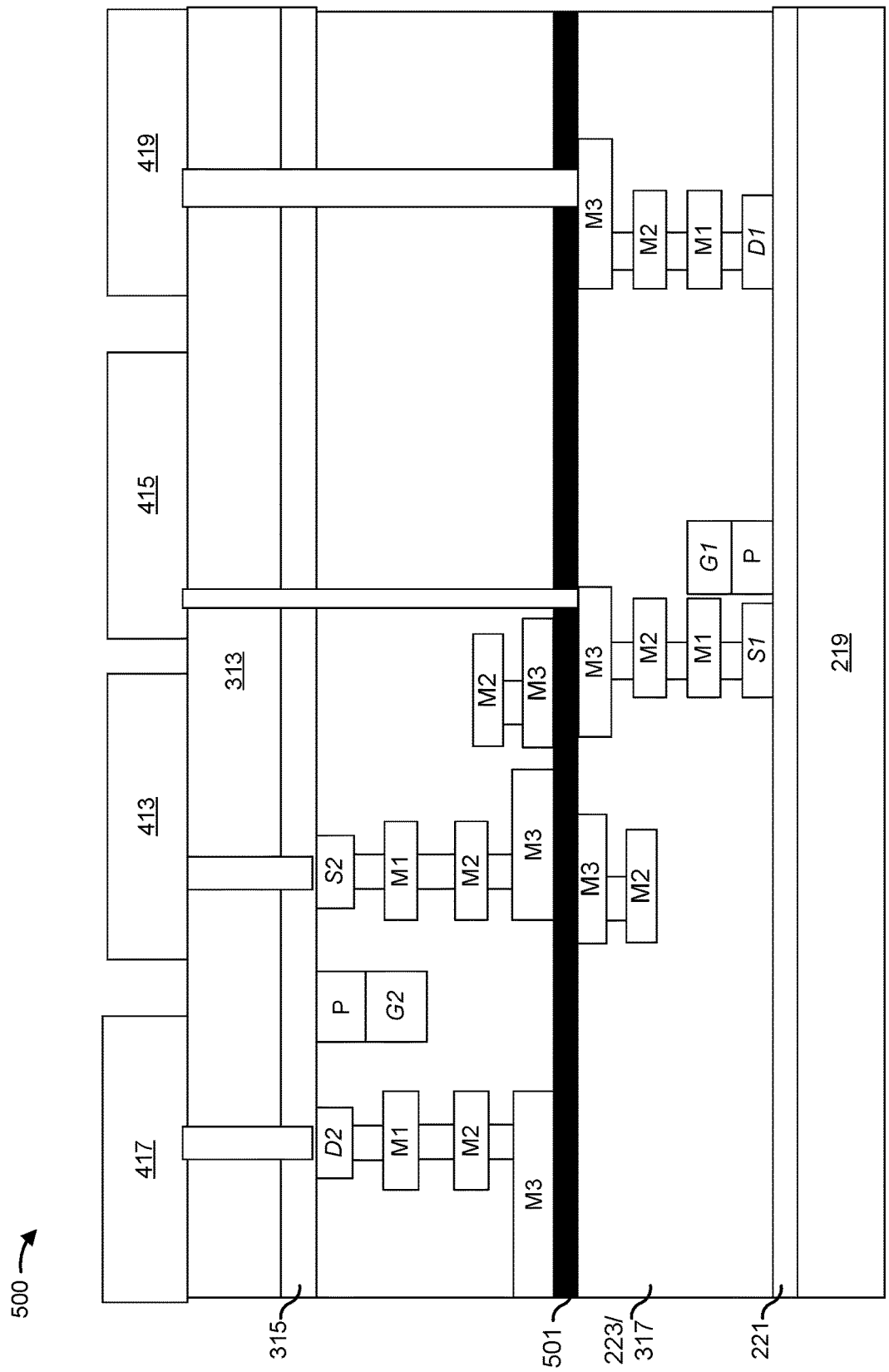

Alternatively, and as shown in FIG. 5F, the RDLs may be formed on a single side of the integrated device. Accordingly, the RDL 419 for the drain D1 may use a metallization layer M3 in the full-bridge device 200 to connect to the drain D1. Similarly, the RDL 415 for the source S1 may use a metallization layer M3 in the full-bridge device 200 to connect to the source S1. As a result, manufacturing time is shortened because the integrated device is not flipped multiple times during processing.

As indicated above, FIGS. 5A-5F are provided as an example. Other examples may differ from what is described with regard to FIGS. 5A-5F.

FIGS. 6A-6E are diagrams of an example implementation 600 described herein. Example implementation 600 may be used to form an integrated device including a full-bridge device 200 and an LLC device 300.

Figure 6A:
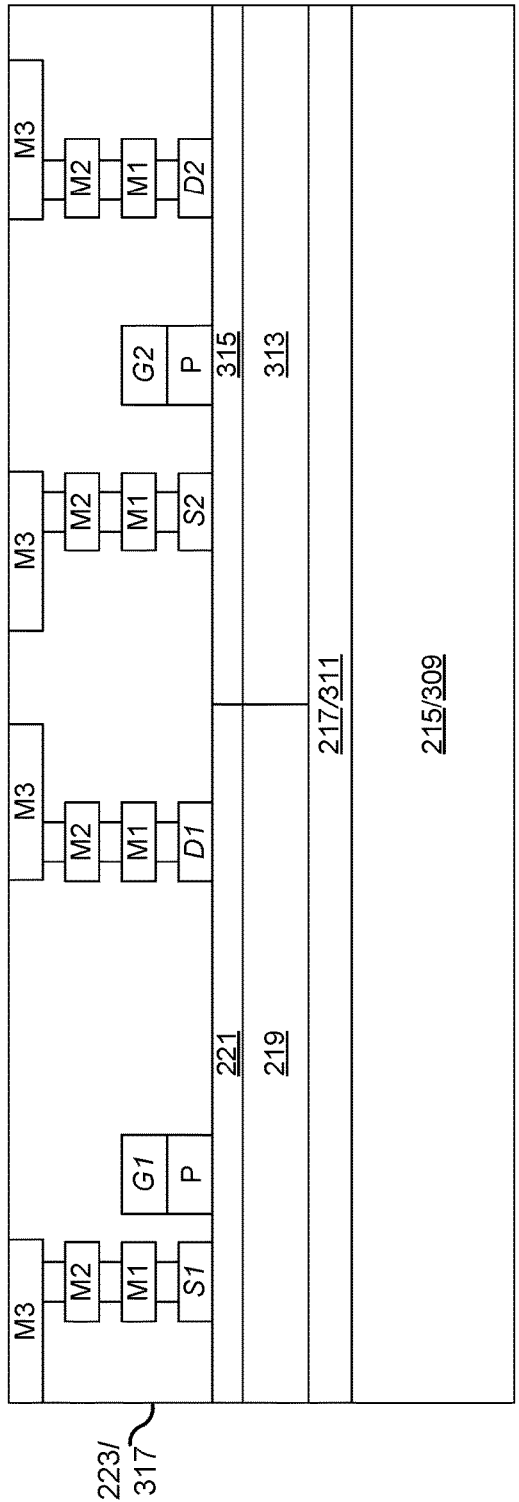
FIGS. 6A-6E are diagrams of an example implementation described herein.

As shown in FIG. 6A, the gate G1, the source S1, and the drain D1 for the full-bridge device 200 may be formed in a dielectric layer 223 (the same as dielectric layer 317 in example implementation 600) over a substrate 215 (the same as substrate 309 in example implementation 600). For example, the deposition tool 120 may form a photoresist layer on the dielectric layer 223 (or on an ESL formed on the dielectric layer 223), the exposure tool 125 may expose the photoresist layer to a radiation source to pattern the photoresist layer, the developer tool 130 may develop and remove portions of the photoresist layer to expose the pattern, and the etch tool 135 may etch portions of the dielectric layer 223. In some implementations, a photoresist removal tool removes the remaining portions of the photoresist layer (e.g., using a chemical stripper, a plasma asher, and/or another technique) after the etch tool 135 etches the dielectric layer 223. Accordingly, the deposition tool 120 may form the gate G1, the source S1, and the drain D1. Similarly, the gate G2, the source S2, and the drain D2 for the LLC device 300 may be formed in the dielectric layer 223 (the same as dielectric layer 317 in example implementation 600) over the substrate 215 (the same as substrate 309 in example implementation 600). Because the gate G1 has a larger breakdown voltage as compared with the gate G2, the exposure tool 125 and the developer tool 130 may form a pattern where the gate G2 is farther from the source S2 than the gate G1 is from the source S1.

Figure 6B:
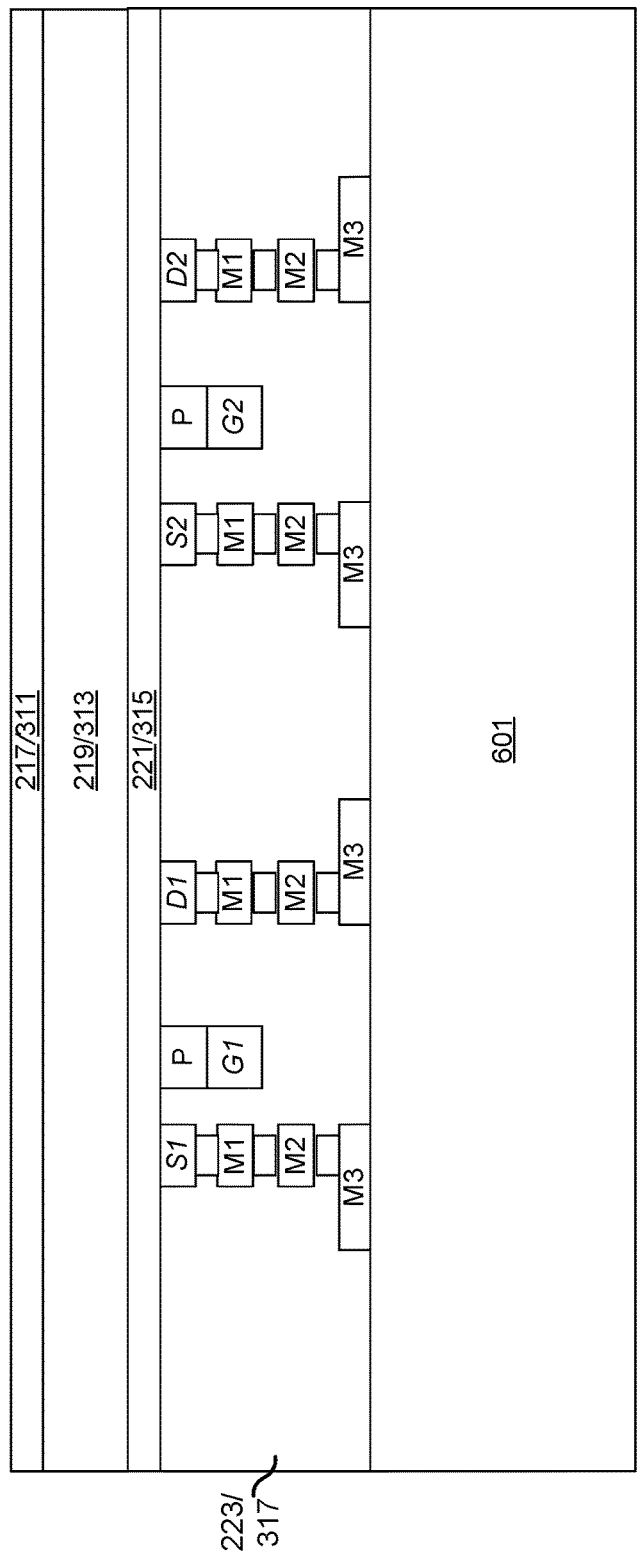

As shown in FIG. 6B, the substrate 215 (the same as substrate 309 in example implementation 600) may be removed. For example, the RDL tool set 105 may debond the substrate 215 to allow for formation of RDLs, as described below. As further shown in FIG. 6B, the dielectric layer 223 may be bonded to a carrier wafer 601. For example, the SMT tool set 145 may mount the integrated device to the carrier wafer (e.g., using direct bonding).

Figure 6C:
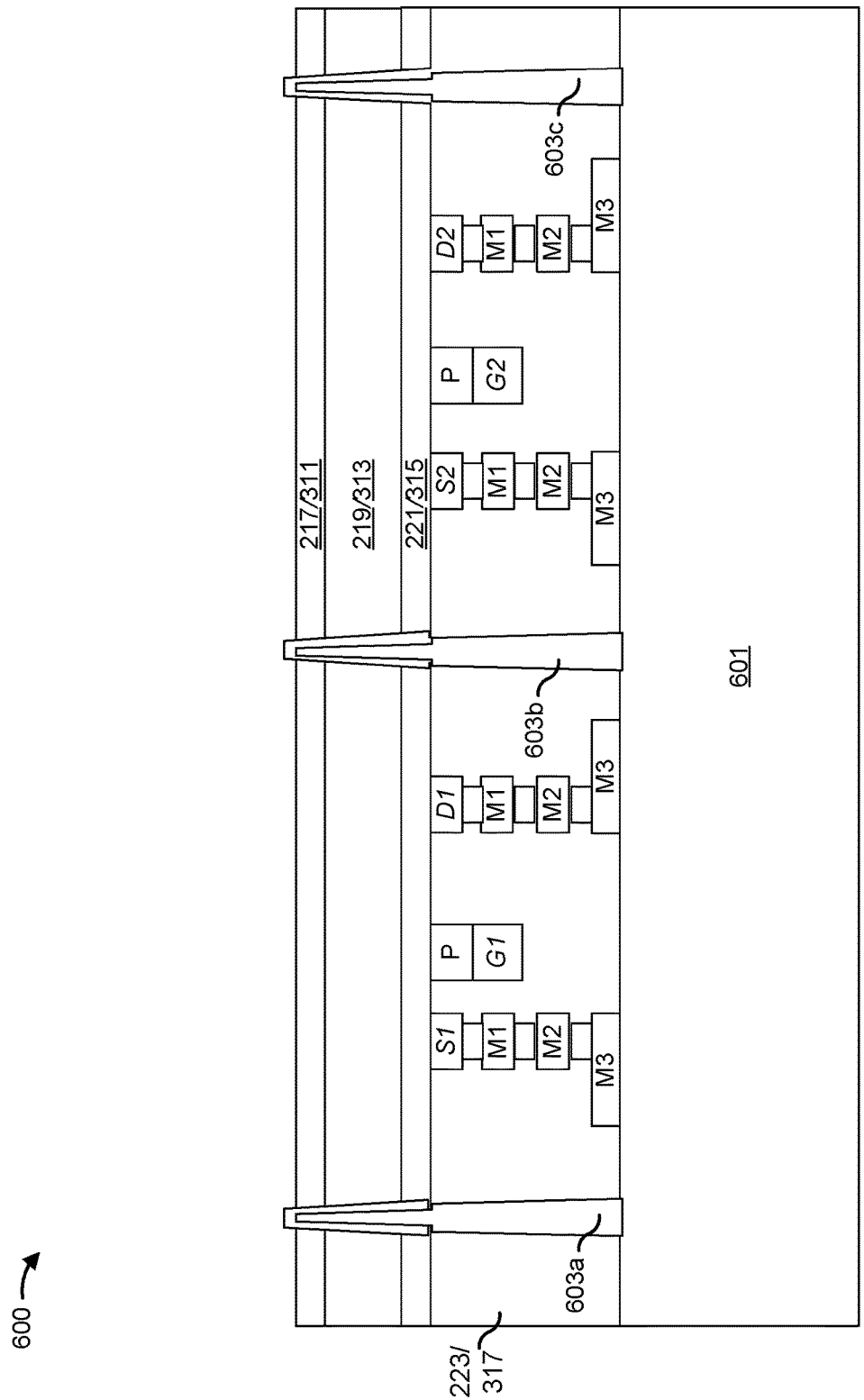

Accordingly, as shown in FIG. 6C, one or more isolation structures (e.g., isolation structures 603a, 603b, and 603c) may be formed between the full-bridge device 200 and the LLC device 300 (and surrounding dielectric material). In some implementations, the isolation structures 603a, 603b, and 603c may be through-glass vias (TGVs). Accordingly, the PCB tool set 140 may form the TGVs to isolate the full-bridge device 200 and the LLC device 300.

Figure 6D:
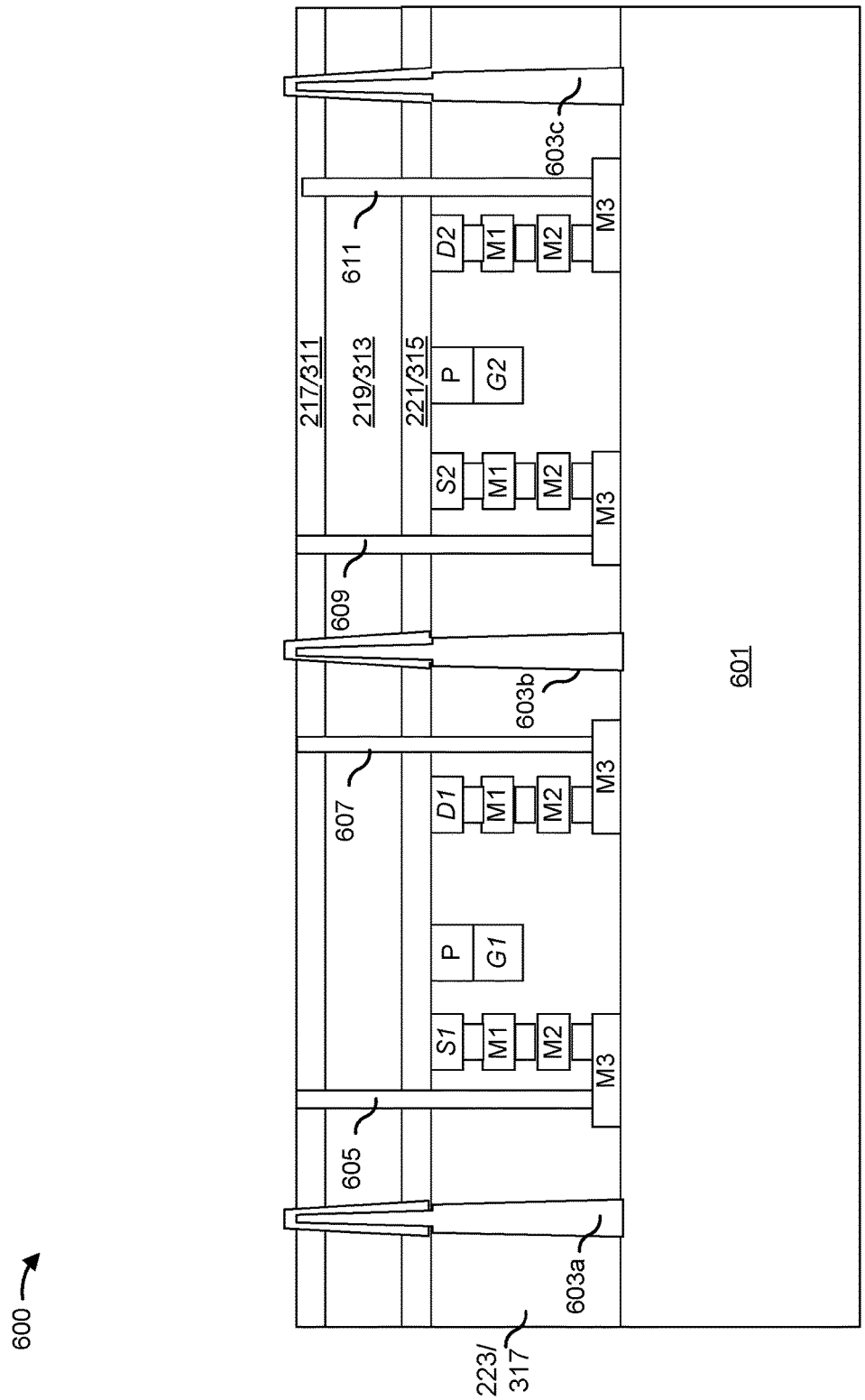

As shown in FIG. 6D, an interconnect 605 to a metallization layer M3 associated with the source S1 and an interconnect 607 to a metallization layer M3 associated with the drain D1 may be formed for the full-bridge device 200. For example, the interconnects 605 and 607 may pass through ESL 217 (the same as ESL 311 in example implementation 500) and layers 219 and 221 (the same as layers 313 and 315 in example implementation 500) and through the dielectric layer 223 (the same as dielectric layer 317 in example implementation 500). In some implementations, the deposition tool 120 may form a photoresist layer on the ESL 217, the exposure tool 125 may expose the photoresist layer to a radiation source to pattern the photoresist layer, the developer tool 130 may develop and remove portions of the photoresist layer to expose the pattern, and the etch tool 135 may etch portions of the ESL 217 and layers below. In some implementations, a photoresist removal tool removes the remaining portions of the photoresist layer (e.g., using a chemical stripper, a plasma asher, and/or another technique) after the etch tool 135 etches the ESL 217 and layers below. Similarly, an interconnect 609 to a metallization layer M3 associated with the source S2 and an interconnect 611 to a metallization layer M3 associated with the drain D2 may be formed for the LLC device 300. For example, the interconnects 609 and 611 may pass through ESL 217 (the same as ESL 311 in example implementation 500) and layers 219 and 221 (the same as layers 313 and 315 in example implementation 500) and through the dielectric layer 223 (the same as dielectric layer 317 in example implementation 500).

Figure 6E:
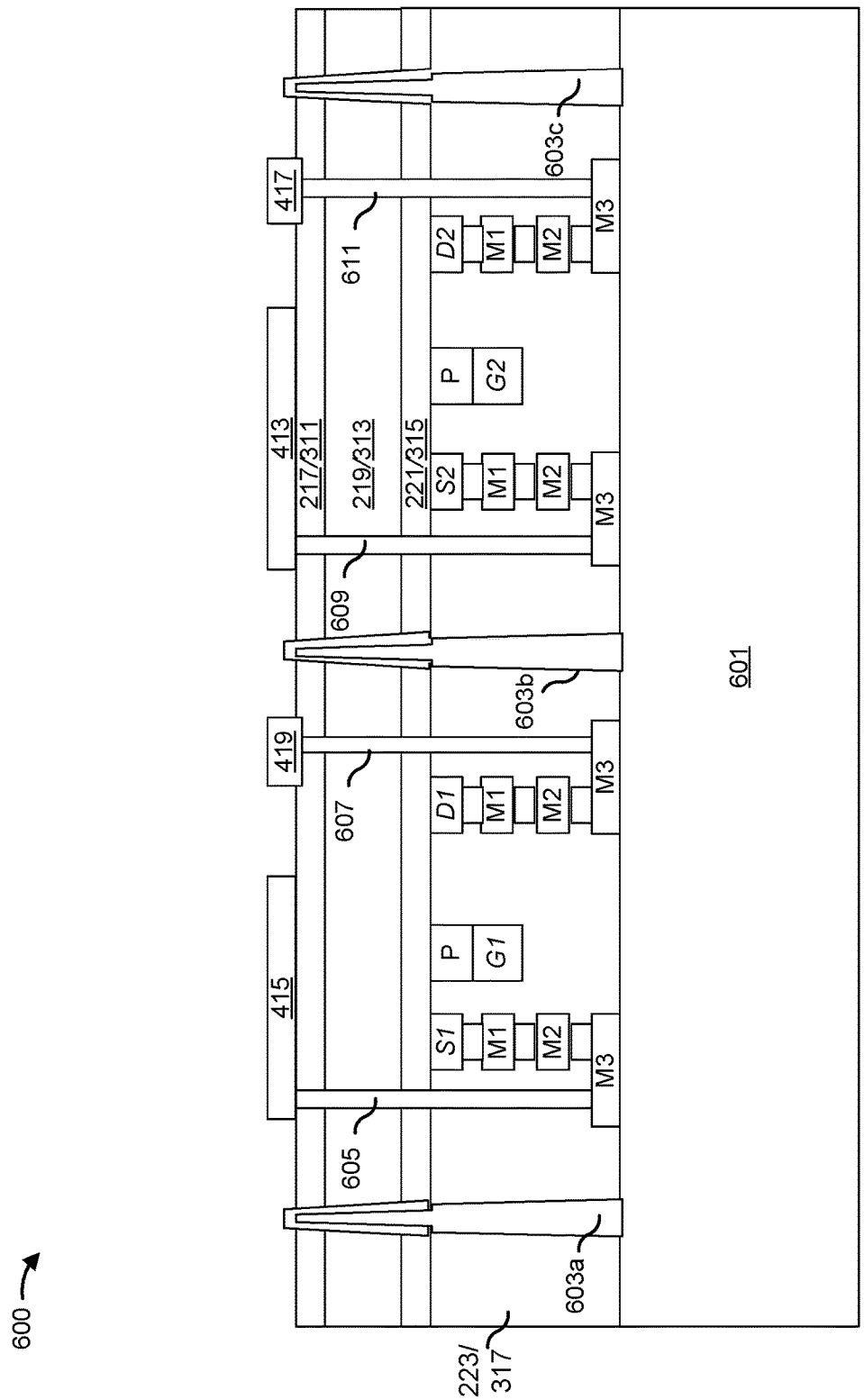

Accordingly, as shown in FIG. 6E, RDLs 413 and 415 may be formed to connect to sources S1 and S2, and RDLs 417 and 419 may be formed to connect to drains D1 and D2. For example, the RDL tool set 105 may form the RDL 413 over the interconnect 609 and the RDL 415 over the interconnect 605. Similarly, the RDL tool set 105 may form the RDL 417 over the interconnect 611 and the RDL 419 over the interconnect 607. Accordingly, additional circuit components for the full-bridge device 200 may be formed over the RDLs 415 and 419. Similarly, additional circuit components for the LLC device 300 may be formed over the RDLs 413 and 417. As a result, chip area for the integrated device is reduced. Additionally, because the integrated device is formed on a single substrate, manufacturing time is shortened because the bonding processes to stack the full-bridge device 200 and the LLC device 300 are foregone.

As indicated above, FIGS. 6A-6E are provided as an example. Other examples may differ from what is described with regard to FIGS. 6A-6E.

Figure 7:
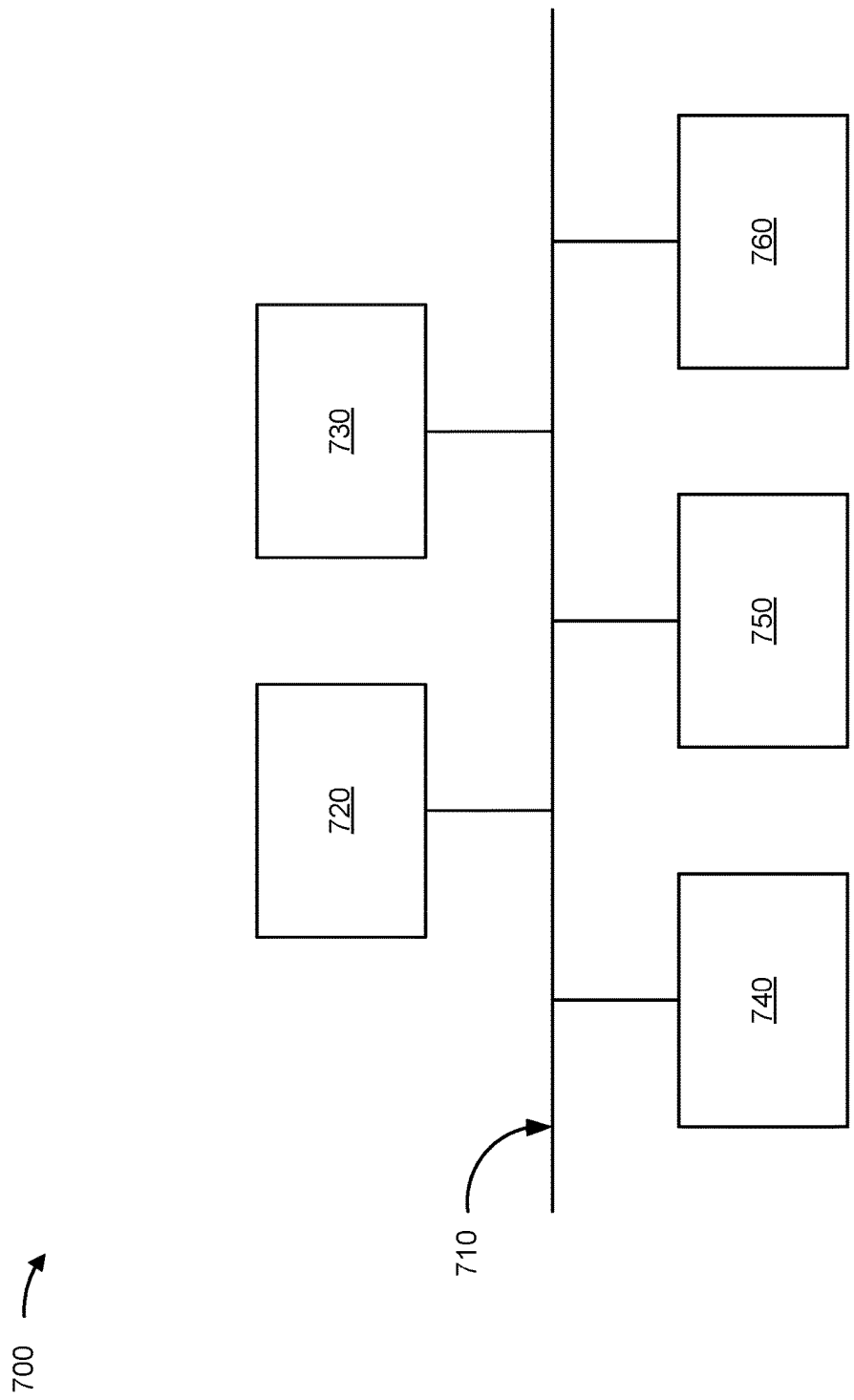
FIG. 7 is a diagram of example components of one or more devices of FIG. 1 described herein.

FIG. 7 is a diagram of example components of a device 700, which may correspond to one or more of the semiconductor processing tool sets 105-150. In some implementations, one or more of the semiconductor processing tool sets 105-150 may include one or more devices 700 and/or one or more components of device 700. As shown in FIG. 7, device 700 may include a bus 710, a processor 720, a memory 730, an input component 740, an output component 750, and a communication component 760.

Bus 710 includes one or more components that enable wired and/or wireless communication among the components of device 700. Bus 710 may couple together two or more components of FIG. 7, such as via operative coupling, communicative coupling, electronic coupling, and/or electric coupling. Processor 720 includes a central processing unit, a graphics processing unit, a microprocessor, a controller, a microcontroller, a digital signal processor, a field-programmable gate array, an application-specific integrated circuit, and/or another type of processing component. Processor 720 is implemented in hardware, firmware, or a combination of hardware and software. In some implementations, processor 720 includes one or more processors capable of being programmed to perform one or more operations or processes described elsewhere herein.

Memory 730 includes volatile and/or nonvolatile memory. For example, memory 730 may include random access memory (RAM), read only memory (ROM), a hard disk drive, and/or another type of memory (e.g., a flash memory, a magnetic memory, and/or an optical memory).

Memory 730 may include internal memory (e.g., RAM, ROM, or a hard disk drive) and/or removable memory (e.g., removable via a universal serial bus connection). Memory 730 may be a non-transitory computer-readable medium. Memory 730 stores information, instructions, and/or software (e.g., one or more software applications) related to the operation of device 700. In some implementations, memory 730 includes one or more memories that are coupled to one or more processors (e.g., processor 720), such as via bus 710.

Input component 740 enables device 700 to receive input, such as user input and/or sensed input. For example, input component 740 may include a touch screen, a keyboard, a keypad, a mouse, a button, a microphone, a switch, a sensor, a global positioning system sensor, an accelerometer, a gyroscope, and/or an actuator. Output component 750 enables device 700 to provide output, such as via a display, a speaker, and/or a light-emitting diode. Communication component 760 enables device 700 to communicate with other devices via a wired connection and/or a wireless connection. For example, communication component 760 may include a receiver, a transmitter, a transceiver, a modem, a network interface card, and/or an antenna.

Device 700 may perform one or more operations or processes described herein. For example, a non-transitory computer-readable medium (e.g., memory 730) may store a set of instructions (e.g., one or more instructions or code) for execution by processor 720. Processor 720 may execute the set of instructions to perform one or more operations or processes described herein. In some implementations, execution of the set of instructions, by one or more processors 720, causes the one or more processors 720 and/or the device 700 to perform one or more operations or processes described herein. In some implementations, hardwired circuitry is used instead of or in combination with the instructions to perform one or more operations or processes described herein. Additionally, or alternatively, processor 720 may be configured to perform one or more operations or processes described herein. Thus, implementations described herein are not limited to any specific combination of hardware circuitry and software.

The number and arrangement of components shown in FIG. 7 are provided as an example. Device 700 may include additional components, fewer components, different components, or differently arranged components than those shown in FIG. 7. Additionally, or alternatively, a set of components (e.g., one or more components) of device 700 may perform one or more functions described as being performed by another set of components of device 700.

Figure 8:
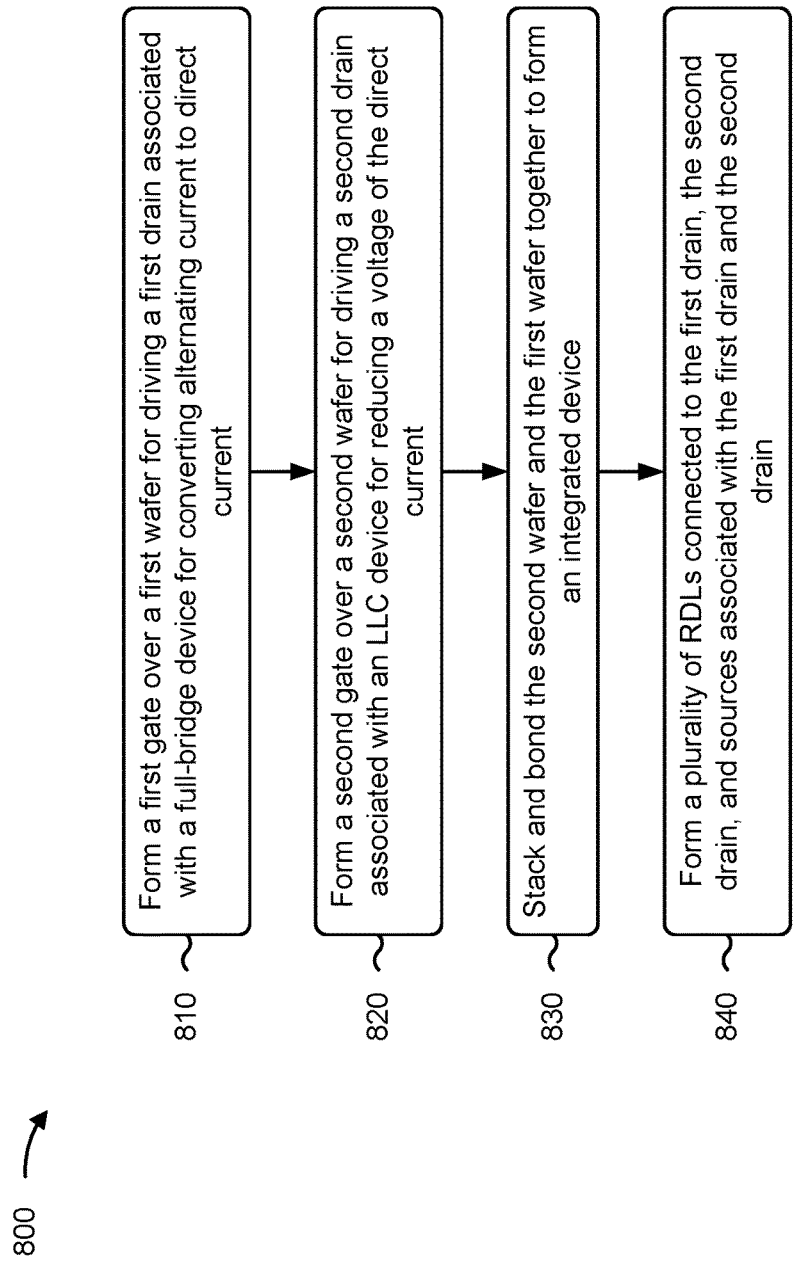
FIGS. 8 and 9 are flowcharts of example processes associated with forming an electronic device described herein.

FIG. 8 is a flowchart of an example process 800 associated with forming integrated electronic devices for converting and downscaling AC. In some implementations, one or more process blocks of FIG. 8 are performed by one or more of the semiconductor processing tool sets 105-150. Additionally, or alternatively, one or more process blocks of FIG. 8 may be performed by one or more components of device 700, such as processor 720, memory 730, input component 740, output component 750, and/or communication component 760.

As shown in FIG. 8, process 800 may include forming a first gate over a first substrate 215 for driving a first drain D1 associated with a full-bridge device 200 for converting AC to DC (block 810). For example, one or more of the semiconductor processing tool sets 105-150, such as the deposition tool 120, may form a first gate G1 over a first substrate 215 for driving a first drain D1 associated with a full-bridge device 200 for converting AC to DC, as described herein.

As further shown in FIG. 8, process 800 may include forming a second gate over a second substrate for driving a second drain associated with an LLC device for reducing a voltage of the DC (block 820). For example, one or more of the semiconductor processing tool sets 105-150, such as the deposition tool 120, may form a second gate G2 over a second substrate 309 for driving a second drain D2 associated with an LLC device 300 for reducing a voltage of the DC, as described herein.

As further shown in FIG. 8, process 800 may include stacking and bonding the second substrate and the first substrate together to form an integrated device (block 830). For example, one or more of the semiconductor processing tool sets 105-150, such as the interconnect tool set 115, may stack and bond the second substrate 309 and the first substrate 215 together to form an integrated device, as described herein.

As further shown in FIG. 8, process 800 may include forming a plurality of RDLs connected to the first drain, the second drain, and sources associated with the first drain and the second drain (block 840). For example, one or more of the semiconductor processing tool sets 105-150, such as the RDL tool set 105, may form a plurality of RDLs 413/415/417/419 connected to the first drain D1, the second drain D2, and sources S1 and S2 associated with the first drain and the second drain, as described herein.

Process 800 may include additional implementations, such as any single implementation or any combination of implementations described below and/or in connection with one or more other processes described elsewhere herein.

In a first implementation, bonding the second substrate 309 and the first substrate 215 together includes using solder structures 401a/401b/401c to connect metallization layers of the first substrate 215 to metallization layers of the second substrate 309.

In a second implementation, alone or in combination with the first implementation, bonding the second substrate 309 and the first substrate 215 together includes using direct bonding to connect the first substrate 215 to the second substrate 309, such that the first substrate 215 and the second substrate 309 are physically and electronically bonded by a first pad M3 associated with the full-bridge device 200 in contact with a second pad M3 associated with the LLC device 300.

In a third implementation, alone or in combination with one or more of the first and second implementations, forming the plurality of RDLs 413/415/417/419 includes forming the plurality of RDLs 413/415/417/419 on a single side of the integrated device.

In a fourth implementation, alone or in combination with one or more of the first through third implementations, forming the plurality of RDLs 413/415/417/419 includes forming the plurality of RDLs 413/415/417/419 on opposing sides of the integrated device.

In a fifth implementation, alone or in combination with one or more of the first through fourth implementations, process 800 further includes forming a first transformer 207 connected to the first drain D1 associated with the full-bridge device 200, and forming a second transformer 303 connected to the second drain D2 associated with the LLC device 300.

In a sixth implementation, alone or in combination with one or more of the first through fifth implementations, process 800 further includes forming a first inductor L1 connected to the first drain D1 associated with the full-bridge device 200, and forming a second inductor L2 connected to the second drain D2 associated with the LLC device 300.

In a seventh implementation, alone or in combination with one or more of the first through sixth implementations, the first gate G1 is associated with a larger breakdown voltage than the second gate G2.

Although FIG. 8 shows example blocks of process 800, in some implementations, process 800 includes additional blocks, fewer blocks, different blocks, or differently arranged blocks than those depicted in FIG. 8. Additionally, or alternatively, two or more of the blocks of process 800 may be performed in parallel.

Figure 9:
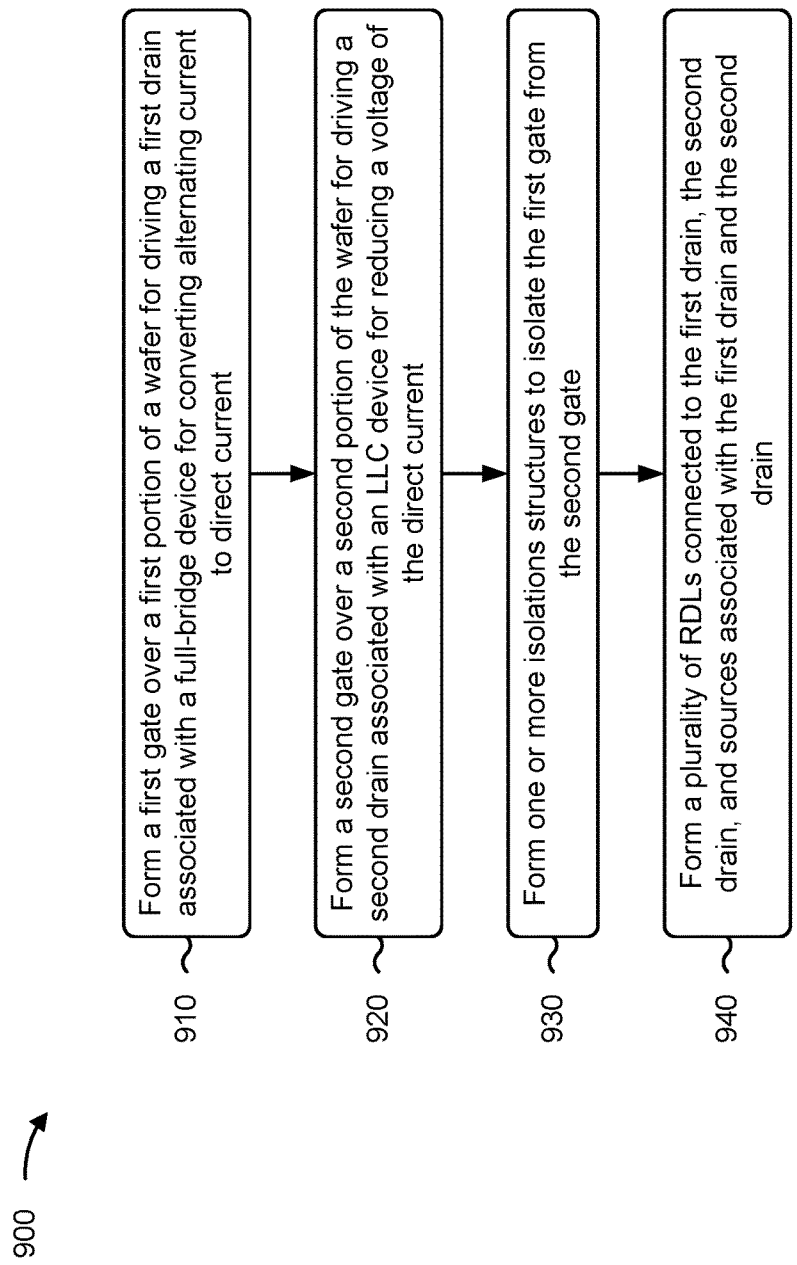

FIG. 9 is a flowchart of an example process 900 associated with forming integrated electronic devices for converting and downscaling AC. In some implementations, one or more process blocks of FIG. 9 are performed by one or more of the semiconductor processing tool sets 105-150. Additionally, or alternatively, one or more process blocks of FIG. 9 may be performed by one or more components of device 700, such as processor 720, memory 730, input component 740, output component 750, and/or communication component 760.

As shown in FIG. 9, process 900 may include forming a first gate over a first portion of a substrate for driving a first drain associated with a full-bridge device for converting AC to DC (block 910). For example, one or more of the semiconductor processing tool sets 105-150, such as the deposition tool 120, may form a first gate G1 over a first portion of a substrate 215/309 for driving a first drain D1 associated with a full-bridge device 200 for converting AC to DC, as described herein.

As further shown in FIG. 9, process 900 may include forming a second gate over a second portion of the substrate for driving a second drain associated with an LLC device for reducing a voltage of the DC (block 920). For example, one or more of the semiconductor processing tool sets 105-150, such as the deposition tool 120, may form a second gate G2 over a second portion of the substrate 215/309 for driving a second drain D2 associated with an LLC device 300 for reducing a voltage of the DC, as described herein.

As further shown in FIG. 9, process 900 may include forming one or more isolations structures to isolate the first gate from the second gate (block 930). For example, one or more of the semiconductor processing tool sets 105-150, such as the deposition tool 120, may form one or more isolations structures 603a/603b/603c to isolate the first gate G1 from the second gate G2, as described herein.

As further shown in FIG. 9, process 900 may include forming a plurality of RDLs connected to the first drain, the second drain, and sources associated with the first drain and the second drain (block 940). For example, one or more of the semiconductor processing tool sets 105-150, such as the RDL tool set 105, may form a plurality of RDLs 413/415/417/419 connected to the first drain D1, the second drain D2, and sources S1 and S2 associated with the first drain and the second drain, as described herein.

Process 900 may include additional implementations, such as any single implementation or any combination of implementations described below and/or in connection with one or more other processes described elsewhere herein.

In a first implementation, process 900 further includes removing the substrate 215/309 from an integrated device including the full-bridge device 200 and the LLC device 300, and attaching the integrated device to a carrier wafer 601.

In a second implementation, alone or in combination with the first implementation, the plurality of RDLs 413/415/417/419 are formed on a side of the integrated device opposite the carrier wafer 601.

In a third implementation, alone or in combination with one or more of the first and second implementations, forming the plurality of RDLs 413/415/417/419 includes forming the plurality of RDLs 413/415/417/419 on a single side of an integrated device including the full-bridge device 200 and the LLC device 300.

In a fourth implementation, alone or in combination with one or more of the first through third implementations, the one or more isolation structures 603a/603b/603c comprise one or more TGVs.

In a fifth implementation, alone or in combination with one or more of the first through fourth implementations, process 900 further includes forming a first transformer 207 connected to the first drain D1 associated with the full-bridge device 200, and forming a second transformer 303 connected to the second drain D2 associated with the LLC device 300.

In a sixth implementation, alone or in combination with one or more of the first through fifth implementations, process 900 further includes forming a first inductor L1 connected to the first drain D1 associated with the full-bridge device 200, and forming a second inductor L2 connected to the second drain D2 associated with the LLC device 300.

In a seventh implementation, alone or in combination with one or more of the first through sixth implementations, the first gate G1 is associated with a larger breakdown voltage than the second gate G2.

Although FIG. 9 shows example blocks of process 900, in some implementations, process 900 includes additional blocks, fewer blocks, different blocks, or differently arranged blocks than those depicted in FIG. 9. Additionally, or alternatively, two or more of the blocks of process 900 may be performed in parallel.

In this way, bonding a full-bridge device and a LLC device in a stack, or forming the full-bridge device and the LLC device on a same substrate, rather than connecting the devices, reduces a chip area associated with a power converter including the full-bridge device and the LLC device. Additionally, the full-bridge device and the LLC device consume less power because parasitic inductance and capacitance are reduced. Additionally, raw materials and production time are conserved that would otherwise have been used to connect the full-bridge device and the LLC device (e.g., via wires).

As described in greater detail above, some implementations described herein provide a method. The method includes forming a first gate over a first substrate for driving a first drain associated with a full-bridge device for converting alternating current to direct current. The method includes forming a second gate over a second substrate for driving a second drain associated with an inductor-inductor-capacitor (LLC) device for reducing a voltage of the direct current. The method includes stacking and bonding the second substrate and the first substrate together to form an integrated device. The method includes forming a plurality of redistribution layers (RDLs) connected to the first drain, the second drain, and sources associated with the first drain and the second drain.

As described in greater detail above, some implementations described herein provide a method. The method includes forming a first gate over a first portion of a substrate for driving a first drain associated with a full-bridge device for converting alternating current to direct current. The method includes forming a second gate over a second portion of the substrate for driving a second drain associated with an inductor-inductor-capacitor (LLC) device for reducing a voltage of the direct current. The method includes forming one or more isolations structures to isolate the first gate from the second gate. The method includes forming a plurality of redistribution layers (RDLs) connected to the first drain, the second drain, and sources associated with the first drain and the second drain.

As described in greater detail above, some implementations described herein provide a device. The device includes a dielectric layer. The device includes a first gate in the dielectric layer for driving a first drain associated with a full-bridge device for converting alternating current to direct current. The device includes a second gate in the dielectric layer for driving a second drain associated with an inductor-inductor-capacitor (LLC) device for reducing a voltage of the direct current. The device includes an insulating structure between the first gate and the second gate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a first gate over a first substrate for driving a first drain associated with a full-bridge device for converting alternating current to direct current;
    forming a second gate over a second substrate for driving a second drain associated with an inductor-inductor-capacitor (LLC) device for reducing a voltage of the direct current;
    stacking and bonding the second substrate and the first substrate together to form an integrated device; and
    forming a plurality of redistribution layers (RDLs) connected to the first drain, the second drain, and sources associated with the first drain and the second drain.

2. The method of claim 1, wherein bonding the second substrate and the first substrate together comprises:
    using solder structures to connect metallization layers of the first substrate to metallization layers of the second substrate.

3. The method of claim 1, wherein bonding the second substrate and the first substrate together comprises:
    using direct bonding to connect the first substrate to the second substrate,
    wherein the first substrate and the second substrate are physically and electronically bonded by a first pad associated with the full-bridge device in contact with a second pad associated with the LLC device.

4. The method of claim 1, wherein forming the plurality of RDLs comprises:
    forming the plurality of RDLs on a single side of the integrated device.

5. The method of claim 1, wherein forming the plurality of RDLs comprises:
    forming the plurality of RDLs on opposing sides of the integrated device.

6. The method of claim 1, further comprising:
    forming a first transformer connected to the first drain associated with the full-bridge device; and
    forming a second transformer connected to the second drain associated with the LLC device.

7. The method of claim 1, further comprising:
    forming a first inductor connected to the first drain associated with the full-bridge device; and
    forming a second inductor connected to the second drain associated with the LLC device.

8. The method of claim 1, wherein the first gate is associated with a larger breakdown voltage than the second gate.

9. A method, comprising:
    forming a first gate over a first portion of a substrate for driving a first drain associated with a full-bridge device for converting alternating current to direct current;
    forming a second gate over a second portion of the substrate for driving a second drain associated with an inductor-inductor-capacitor (LLC) device for reducing a voltage of the direct current;
    forming one or more isolation structures to isolate the first gate from the second gate; and
    forming a plurality of redistribution layers (RDLs) connected to the first drain, the second drain, and sources associated with the first drain and the second drain.

10. The method of claim 9, further comprising:
    removing the substrate from an integrated device including the full-bridge device and the LLC device; and
    attaching the integrated device to a carrier wafer.

11. The method of claim 10, wherein the plurality of RDLs are formed on a side of the integrated device opposite the carrier wafer.

12. The method of claim 9, wherein forming the plurality of RDLs comprises:
    forming the plurality of RDLs on a single side of an integrated device including the full-bridge device and the LLC device.

13. The method of claim 9, wherein the one or more isolation structures comprise one or more through-glass vias (TGVs).

14. The method of claim 9, further comprising:
    forming a first transformer connected to the first drain associated with the full-bridge device; and
    forming a second transformer connected to the second drain associated with the LLC device.

15. The method of claim 9, further comprising:
    forming a first inductor connected to the first drain associated with the full-bridge device; and
    forming a second inductor connected to the second drain associated with the LLC device.

16. The method of claim 9, wherein the first gate is associated with a larger breakdown voltage than the second gate.

17. A device, comprising:
    a dielectric layer;
    a first gate in the dielectric layer for driving a first drain associated with a full-bridge device for converting alternating current to direct current;
    a second gate in the dielectric layer for driving a second drain associated with an inductor-inductor-capacitor (LLC) device for reducing a voltage of the direct current; and
    an insulating structure between the first gate and the second gate.

18. The device of claim 17, wherein the insulating structure comprises through-glass vias (TGVs) to isolate the first gate from the second gate.

19. The device of claim 17, wherein the insulating structure comprises a dielectric layer that separates the first gate from the second gate along a vertical direction.

20. The device of claim 17, further comprising:
   a plurality of redistribution layers (RDLs) connected to the first drain, the second drain, and sources associated with the first drain and the second drain.

* * * * *